(12) United States Patent
Cho et al.

(10) Patent No.: US 10,903,457 B2
(45) Date of Patent: Jan. 26, 2021

(54) DISPLAY DEVICE AND METHOD OF MANUFACTURING THE SAME

(71) Applicant: Samsung Display Co., Ltd., Yongin-si (KR)

(72) Inventors: Ki Hyun Cho, Hwaseong-si (KR); Yong Hui Lee, Hwaseong-si (KR); Jung Hwa Kim, Hwaseong-si (KR); Ji Hoon Kim, Suwon-si (KR); Byung Seon An, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/528,187

(22) Filed: Jul. 31, 2019

(65) Prior Publication Data
US 2020/0052248 A1    Feb. 13, 2020

(30) Foreign Application Priority Data
Aug. 13, 2018    (KR) .......................... 10-2018-0094324

(51) Int. Cl.
*H01L 51/52*    (2006.01)
*H01L 51/00*    (2006.01)

(52) U.S. Cl.
CPC ...... *H01L 51/5284* (2013.01); *H01L 51/0097* (2013.01); *H01L 2251/5338* (2013.01)

(58) Field of Classification Search
CPC ............. H01L 51/0097; H01L 51/5253; H01L 27/3276; H01L 51/52; H01L 51/5246
USPC .................................................... 257/773, 98
See application file for complete search history.

(56) References Cited

U.S. PATENT DOCUMENTS

| 2014/0042406 | A1  |  2/2014 | Degner et al. |
| 2017/0371465 | A1* | 12/2017 | Ahn ........................ G06F 3/044 |
| 2019/0094610 | A1* |  3/2019 | Yukawa ............ G02F 1/133308 |
| 2019/0097178 | A1* |  3/2019 | Cho ........................ G09F 9/301 |
| 2019/0305256 | A1* | 10/2019 | Wu ........................ G06F 1/1618 |

* cited by examiner

*Primary Examiner* — Caleen O Sullivan
(74) *Attorney, Agent, or Firm* — Lewis Roca Rothgerber Christie LLP

(57) ABSTRACT

A display device and a method of manufacturing the same are provided. A display device includes: a display panel including a first area, a second area, and a bending area between the first area and the second area; a first polarizing film on a first surface of the first area of the display panel; and a second polarizing film on a first surface of the second area of the display panel, and the first and second polarizing films are spaced apart from each other with the bending area therebetween.

21 Claims, 31 Drawing Sheets

DISPLAY DEVICE AND METHOD OF MANUFACTURING THE SAME

CROSS-REFERENCE TO RELATED APPLICATION

This application claims priority to and the benefit of Korean Patent Application No. 10-2018-0094324, filed on Aug. 13, 2018 in the Korean Intellectual Property Office, the entire disclosure of which is incorporated herein by reference.

BACKGROUND

1. Field

Aspects of embodiments of the present disclosure relate to a display device and a method of manufacturing the same.

2. Description of the Related Art

A flexible display device can be used not only in portable electronic devices, such as a mobile phone, a smartphone, a tablet personal computer (PC), a smart watch, a watch phone, a mobile communication terminal, an electronic notebook, an electronic book, a portable multimedia player (PMP), a navigation device, or an ultra-mobile PC (UMPC), but also in various other products, such as a television (TV), a notebook computer, a monitor, a billboard, or an Internet-of-Things (IoT) device.

A flexible display device, which is a display device having a display unit and a driving unit formed on a flexible substrate, including a flexible material, so as to be able to display an image even when bent like paper, has attracted attention as a next-generation display device. The flexible display device may be bent to have a predetermined thickness in a thickness direction. However, as the predetermined thickness increases, the dead space of the flexible display device increases. Thus, research has been conducted on ways to reduce the predetermined thickness.

SUMMARY

According to an aspect of exemplary embodiments of the present disclosure, a slim display device is provided.

According to an aspect of exemplary embodiments of the present disclosure, a method of manufacturing a slim display device with an improved process efficiency is provided.

However, aspects of exemplary embodiments of the present disclosure are not restricted to those set forth herein. The above and other aspects of exemplary embodiments of the present disclosure will become more apparent to one of ordinary skill in the art to which the present disclosure pertains by referencing the detailed description of the present disclosure given below.

According to one or more exemplary embodiments of the present disclosure, a display device includes: a display panel including a first area, a second area, and a bending area between the first area and the second area; a first polarizing film on a first surface of the first area of the display panel; and a second polarizing film on a first surface of the second area of the display panel, wherein the first and second polarizing films are spaced apart from each other with the bending area therebetween.

In an exemplary embodiment, the first and second areas of the display panel overlap with each other in a thickness direction, and second surfaces of the first and second areas of the display panel are opposite to each other.

In an exemplary embodiment, the second polarizing film overlaps with the first polarizing film in the thickness direction.

In an exemplary embodiment, the first and second polarizing films include a same material.

In an exemplary embodiment, a thickness of the first polarizing film is the same as a thickness of the second polarizing film.

In an exemplary embodiment, a display device may further include an adhesive member between the second surfaces of the first and second areas of the display panel and bonding the second surfaces of the first and second areas of the display panel.

In an exemplary embodiment, a display device may further include a gap between a first side of the adhesive member and a second surface of the bending area of the display panel; and a spacer in the gap, wherein the spacer is in contact with the first side of the adhesive member and the second surface of the bending area of the display panel.

In an exemplary embodiment, a display device may further include a passivation film on a first surface of the bending area of the display panel.

In an exemplary embodiment, a first side of the passivation film faces a first side of the first polarizing film, and a second side of the passivation film faces a first side of the second polarizing film.

In an exemplary embodiment, the passivation film covers a part of a top surface of the first polarizing film or a part of a top surface of the second polarizing film.

In an exemplary embodiment, a direction in which a first side of the first polarizing film extends is the same as a direction in which a first side of the second polarizing film extends, and the first sides of the first and second polarizing films face each other.

In an exemplary embodiment, a distance between the first sides of the first and second polarizing films is uniform along the direction in which the first side of the first polarizing film extends.

In an exemplary embodiment, a display device may further include a driver chip on the first surface of the second area of the display panel, wherein the second polarizing film is between the bending area and the driver chip.

In an exemplary embodiment, the second polarizing film covers a first side and a top surface of the driver chip.

In an exemplary embodiment, the second area of the display panel includes a sub-area adjacent to the bending area and a driver chip area adjacent to an end of the second area, and the second polarizing film is located in the sub-area and the driver chip area and in a part of the driver chip area between a second surface of the display panel and the driver chip.

In an exemplary embodiment, the first and second polarizing films include burr-shaped portions near the bending area.

In an exemplary embodiment, the display panel includes recessed scratches near the bending area in the thickness direction.

In an exemplary embodiment, the display panel includes soot on the first surface of the bending area of the display panel.

According to one or more embodiments of the present disclosure, a method of manufacturing a display device includes: arranging a polarizing film on a first surface of a display panel including a first area, a second area, and a bending area between the first area and the second area; and separating the polarizing film into a first polarizing film, which is on the first area of the display panel, and a second polarizing film, which is on the second area of the display panel, by removing the polarizing film from the bending area of the display panel and from an area on a side of the second area of the display panel.

In an exemplary embodiment, the method of manufacturing a display device further includes arranging a passivation film on the bending area of the display panel, and arranging a driver chip in an area where the second area of the display panel is exposed.

According to an aspect of the aforementioned and other exemplary embodiments of the present disclosure, a slim display device may be provided.

According to another aspect, a method of manufacturing a slim display device with an improved process efficiency may be provided.

Other features and exemplary embodiments may be apparent from the following detailed description, the drawings, and the claims.

BRIEF DESCRIPTION OF THE DRAWINGS

The above and other aspects and features of the present invention will become more apparent by describing in further detail some exemplary embodiments thereof with reference to the attached drawings, in which.

DETAILED DESCRIPTION

Figure 1:
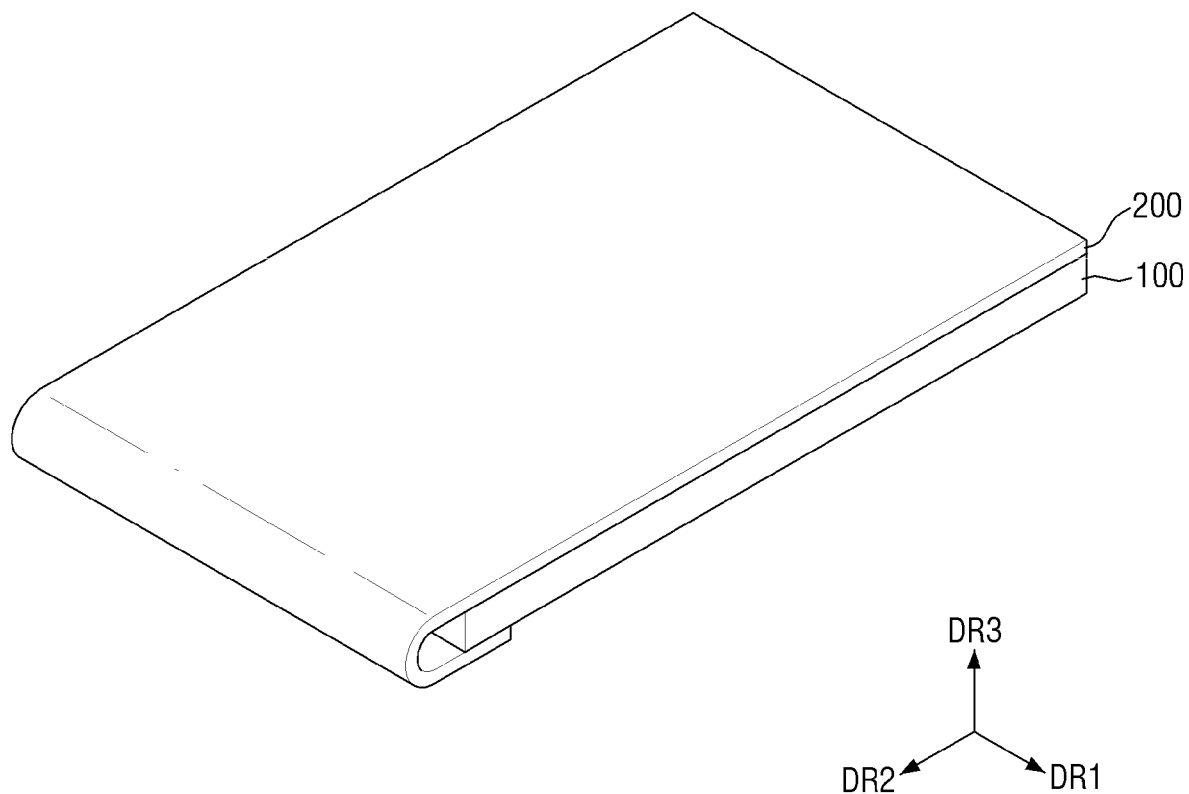
FIG. 1 is a perspective view of a display device according to an exemplary embodiment of the present disclosure.

Aspects and features of the present invention and methods for achieving the aspects and features will be apparent by referring to some exemplary embodiments to be described in further detail with reference to the accompanying drawings. However, the invention is not limited to the embodiments disclosed herein, but may be implemented in various forms. The matters defined in the description, such as the detailed construction and elements, are merely provided to assist those of ordinary skill in the art in a comprehensive understanding of the invention and are not limiting of the invention, which is set forth within the spirit and scope of the appended claims.

Where an element is described as being related to another element, such as being "on" another element or "located on" a different element or a layer, this includes both a case in which an element is located directly on another element or a layer and a case in which an element is located on another element via one or more other layers or one or more other elements. In contrast, where an element is described as being is related to another element such as being "directly on" another element or "located directly on" a different element or a layer, this indicates a case in which an element is located on another element or a layer with no intervening element or layer therebetween.

Throughout the specification, the same reference numerals are used for the same or similar parts.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise. It is to be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
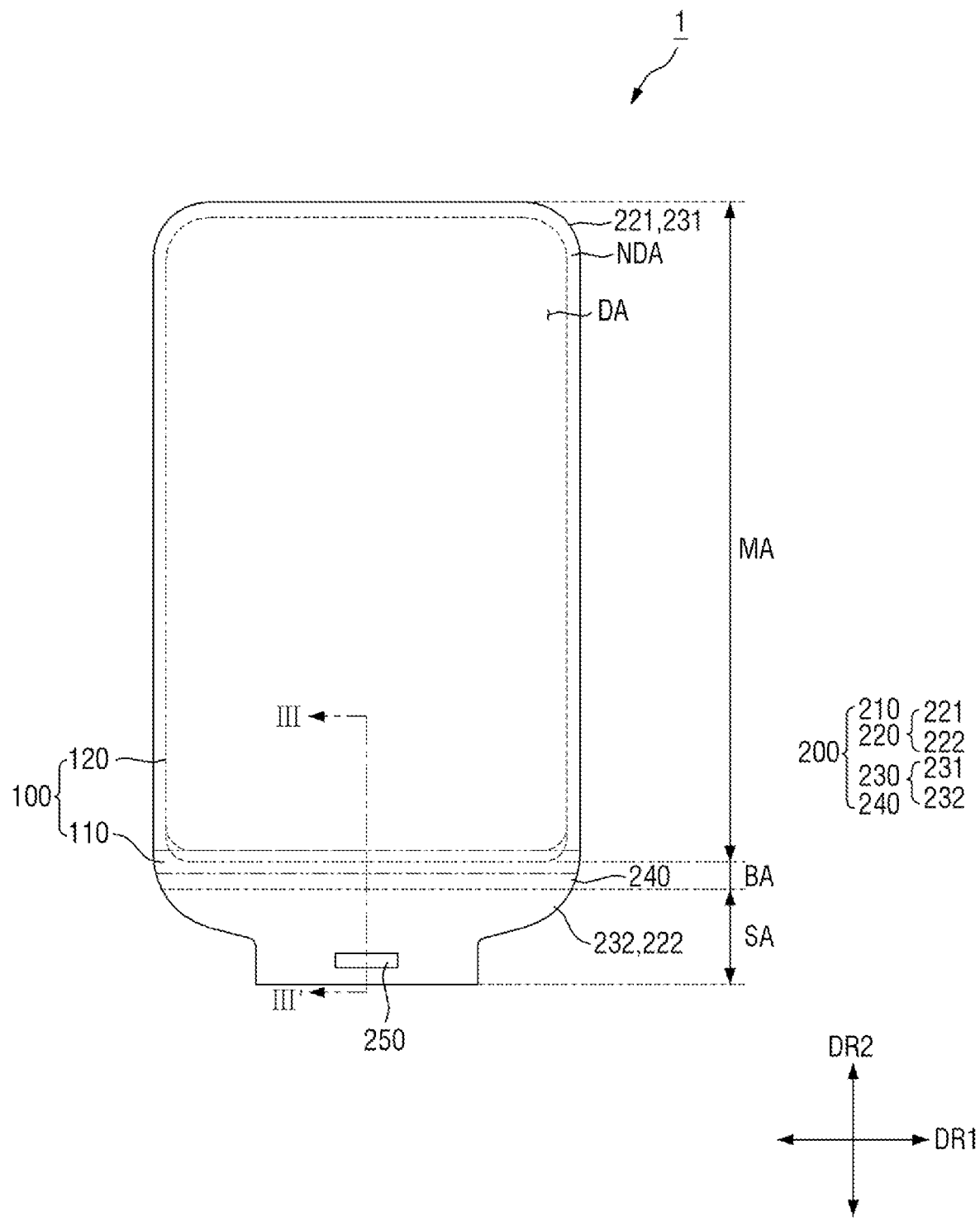
FIG. 2 is a layout view of the display device of FIG. 1.
Figure 3:
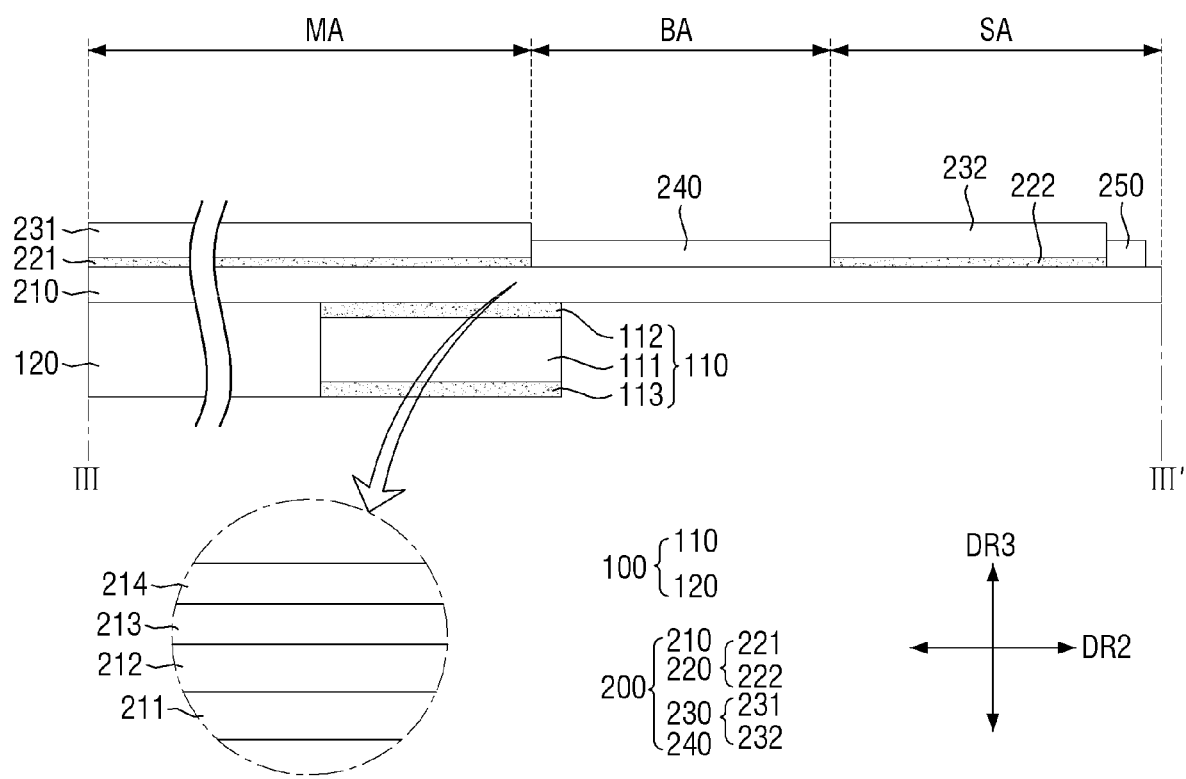
FIG. 3 is a cross-sectional view, taken along the line III-III' of FIG. 2, of the display device of FIG. 1.
Figure 4:
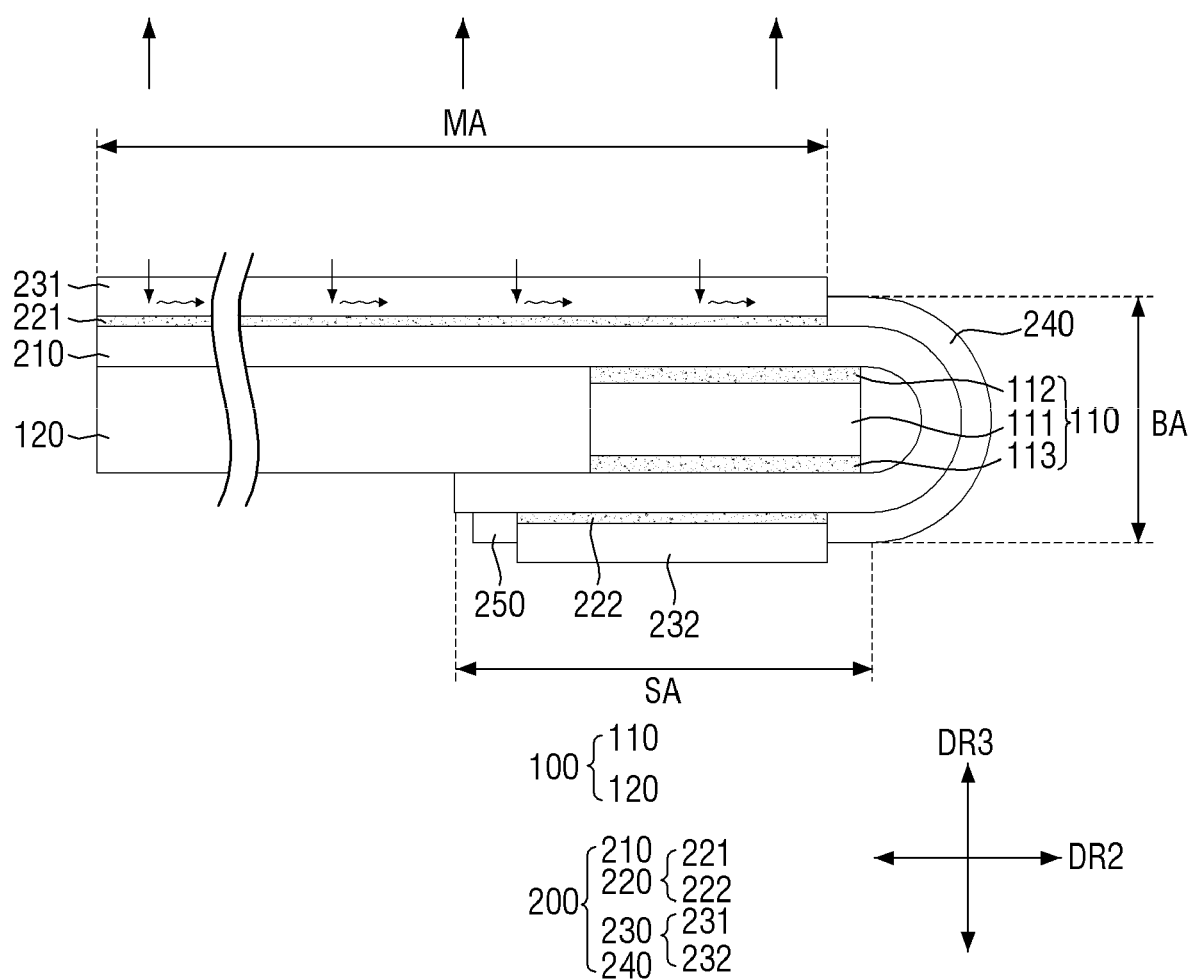
FIG. 4 is a cross-sectional view illustrating the display device of FIG. 3 in a bent state.

FIG. 1 is a perspective view of a display device according to an exemplary embodiment of the present disclosure; FIG. 2 is a layout view of the display device of FIG. 1; FIG. 3 is a cross-sectional view, taken along the line III-III' of FIG. 2, of the display device of FIG. 1; and FIG. 4 is a cross-sectional view illustrating the display device of FIG. 3 in a bent state.

Referring to FIGS. 1 through 4, a display device 1 may include a display module 200, which displays an image, and a panel bottom structure 100, which is disposed below the display module 200. As illustrated in FIG. 1, the display module 200 may be bent to surround a side of the panel bottom structure 100 from the outside.

Although not specifically illustrated, the display device 1 may include a window disposed above the display module 200. The window protects the display module 200 and transmits light emitted from the display module 200 therethrough. The window may overlap with the display module 200 and may be disposed to cover the entire surface of the display module 200. The window may be formed of glass or the like.

In an embodiment, the display device 1 may further include a touch member disposed between the window and the display module 200. For example, the touch member may have substantially the same size as the display module 200 and may be disposed to overlap with the display module 200, and the sides of the touch member may be aligned with the sides of the display module 200. However, the present disclosure is not limited to this example. The touch member may be of a rigid panel type or of a flexible panel or film type.

The display module 200 and the touch member, and the touch member and the window, may be bonded together via transparent bonding layers (not illustrated), such as an optically clear adhesive (OCA) or an optically clear resin (OCR). In an embodiment, the touch member may not be provided, in which case, the display module 200 and the window may be bonded together via the transparent bonding layer. In some exemplary embodiments, the display module 200 may include a touch electrode unit therein.

The display module 200 may include a display panel 210, which displays an image, a polarizing film 230, which is disposed on a part of a first surface of the display panel 210, and a passivation film 240, which is disposed on a part of the first surface of the display panel 210, exposed by the polarizing film 230.

The display panel 210 may be an organic light-emitting diode (OLED) panel, a liquid crystal display (LCD) panel, a field emission display (FED) panel, or an electrophoretic display panel, for example. In the description that follows, it is assumed that an OLED display panel is used as the display panel 210.

As illustrated in FIG. 2, the display panel 210 may include a display area DA in which an image is displayed and a non-display area NDA which is disposed at the periphery of the display area DA. In an embodiment, in a plan view, the display device 1 may have a rectangular shape with right-angled or rounded edges. However, the shape of the display area DA is not particularly limited, and the display area DA may have a circular shape, an elliptical shape, or any of various other shapes. The non-display area NDA may be disposed at the periphery of the display area DA. In a case in which, in a plan view, the display area DA has a rectangular shape with right-angled or rounded edges, the display area DA includes two long sides and two short sides, and the non-display area NDA may be disposed adjacent to at least one side of the display area DA. FIGS. 1 through 4 illustrate an example in which the non-display area NDA is disposed adjacent to both long sides and both short sides of the display area DA.

In an exemplary embodiment, the display area DA and parts of the non-display area NDA may form a main area MA. The main area MA may include the entire display area DA and parts of the non-display area NDA adjacent to both long sides and the upper short side, in a second direction DR2, of the display area DA. As illustrated in FIG. 3, the main area MA may be generally flat.

Another part of the non-display area NDA may form a bending area BA. The bending area BA may be disposed on at least one side of the main area MA. FIGS. 1 through 4 illustrate an example in which a single bending area BA is disposed adjacent to the lower side of the main area MA, but the bending area BA may also be disposed adjacent to the other sides of the main area MA, i.e., the left, right, and upper sides of the main area MA. The bending area BA may also be disposed on two or more sides of the main area MA. The bending area BA may be bent in a direction opposite to a display direction, e.g., in a downward direction in a case in which the display device 1 is of a top emission type (i.e., in a direction toward below the main area MA).

Another part of the non-display area NDA may form a sub-area SA. The sub-area SA is disposed to extend from the bending area BA. The sub-area SA may be parallel to the main area MA when the display panel 210 is bent. The sub-area SA may overlap with the main area MA in a thickness direction. In an exemplary embodiment, the entire sub-area SA may overlap with the main area MA in the thickness direction.

The display panel 210 may include a base substrate 211, a driving layer 212, an organic light-emitting element layer 213, and an encapsulation layer 214. The base substrate 211 may be disposed in and across the main area MA, the bending area BA, and the sub-area SA. The base substrate 211 may be a flexible substrate including a flexible material, such as polyimide.

In an embodiment, the driving layer 212 may be disposed on the entire surface of the base substrate 211. The driving layer 212 may include elements for providing signals to the organic light-emitting element layer 213. The driving layer 212 may include various signal lines, for example, scan lines (not illustrated), data lines (not illustrated), power lines (not illustrated), and emission lines (not illustrated). The driving layer 212 may include transistors and capacitors. The transistors include a switching transistor (not illustrated) and a driving transistor (not illustrated), which are provided in each pixel (not illustrated).

The organic light-emitting element layer 213 may be disposed on the first surface of the main area MA of the display panel 210. The organic light-emitting element layer 213 may include an organic light-emitting diode (not illustrated). For example, a front emission-type organic light-emitting diode may be provided and may emit light through a display surface. The organic light-emitting diode may include an anode electrode (not illustrated), an organic layer (not illustrated) and a cathode electrode (not illustrated). The cathode electrode may be a common electrode, but the present disclosure is not limited thereto.

The organic light-emitting element layer 213 may be sealed by the encapsulation layer 214. The encapsulation layer 214 may seal the organic light-emitting element layer 213 and may thus prevent or substantially prevent external air and/or moisture from penetrating the organic light-emitting element layer 213. The encapsulation layer 214 may be formed as a single- or multilayer inorganic film or as a layer in which an inorganic film and an organic film are alternately stacked.

The polarizing film 230 may be disposed on the first surface of the display panel 210. The polarizing film 230 may be attached to the display panel 210 via a first adhesive member 220, which is disposed between the polarizing film 230 and the display panel 210. In an embodiment, the polarizing film 230 may be disposed in the main area MA and the sub-area SA of the display panel 210, but not in the bending area BA of the display panel 210, and may thus expose a part of the first surface of the bending area BA of the display panel 210. The passivation film 240 may be further disposed on the part of the first surface of the bending area BA, exposed by the polarizing film 230. The polarizing film 230 may further expose a part of the sub-area SA that is distant from the bending area BA. Pad terminals (not illustrated) may be disposed on the part of the first surface of the sub-area SA, exposed by the polarizing film 230, and a data driver integrated circuit 250 may be connected to the pad terminals with an anisotropic conductive film (ACF) disposed between the pad terminals.

The panel bottom structure 100 may be disposed on a second surface of the display module 200. In an embodiment, the panel bottom structure 100 may overlap with the main area MA and the sub-area SA of the display panel 210 and may also overlap with a part of the bending area BA that is adjacent to the main area MA. The panel bottom structure 100 may be disposed to face, and be parallel to, the main area MA and the sub-area SA, which faces the main area MA in the thickness direction when the display panel 210 is bent. The panel bottom structure 100 may include a second adhesive member 110 and a lower sheet 120.

When the display device 1 is bent, the second adhesive member 110 may partially overlap with the main area MA and the sub-area SA and may extend beyond the main area MA and the sub-area SA to partially overlap with the bending area BA. The second adhesive member 110 may bond the main area MA and the sub-area SA, which overlaps with the main area MA in the thickness direction when the display panel 210 is bent. In an embodiment, the second adhesive member 110 may include a buffer material and may thus absorb external and/or internal shock applied to parts of the display panel 210 that are bonded together in the thickness direction. In an embodiment, the second adhesive member 110 may include a foam material. Also, where the second adhesive member 110 further extends to overlap with the bending area BA, the second adhesive member 110 may fix the bent state of the display panel 210, but the present disclosure is not limited thereto. Alternatively, the second adhesive member 110 may be disposed to overlap only with the main area MA and the sub-area SA, but not with the bending area BA.

The display device 1 may have a gap between the display panel 210 bent in the bending area BA and the first adhesive member 110. In one or more exemplary embodiments, a spacer member (130 of FIG. 21) may be provided in the gap.

In an exemplary embodiment, the type of the second adhesive member 110 is not particularly limited as long as the second adhesive member 110 has an adhesive function. For example, the second adhesive member 110 may be a double-sided tape. In an embodiment, the second adhesive member 110 may include a tape substrate 111, a first adhesive layer 112 disposed between a first surface of the tape substrate 111 and the second surface of the display panel 210, and a second adhesive layer 113 disposed between a second surface of the tape substrate 111 and the second surface of the display panel 210.

In an embodiment, the tape substrate 111 may be formed of polyethylene terephthalate (PET), polyimide (PI), polycarbonate (PC), polyethylene (PE), polypropylene (PP), polysulfone (PSF), polymethyl methacrylate (PMMA), triacetyl cellulose (TAC), a cyclo-olefin polymer (COP), or the like. The first and second adhesive layers 112 and 113 may be adhesive layers or resin layers. For example, the first and second adhesive layers 112 and 113 may contain a polymer material, such as a silicone-based polymer, a urethane-based polymer, a silicone-urethane hybrid polymer, an acrylic polymer, an isocyanate polymer, a polyvinyl alcohol polymer, a gelatin polymer, a vinyl polymer, a latex polymer, a polyester polymer, or a water-based polyester polymer.

The lower sheet 120 may be disposed adjacent to the second adhesive member 110 in the second direction DR2, may overlap with the second surface of the main area MA of the display panel 210 in the thickness direction, and may partially overlap with the second surface of the sub-area SA of the display panel 210. The lower sheet 120 may include at least one functional layer. The functional layer may be a layer that performs a heat dissipation function, an electromagnetic wave shielding function, a grounding function, a buffering function, an intensity enhancement function, a support function, and/or a digitizing function, for example. The functional layer may be a sheet layer, a film layer, a thin layer, a coating layer, a panel, a plate, or the like. One functional layer may be formed as a single-layer film, but may also be formed as a stack of a plurality of thin films or coating layers. The functional layer may be, for example, a supporting substrate, a heat dissipation layer, an electromagnetic wave shielding layer, a shock absorbing layer, or a digitizer.

As described above, the polarizing film 230 may be disposed on the first surface of the display panel 210. The polarizing film 230 may be attached to the display panel 210 via the first adhesive member 220, which is disposed between the polarizing film 230 and the display panel 210. The first adhesive member 220 may be a transparent bonding layer such as an OCA or an OCR, but the present disclosure is not limited thereto. Alternatively, the first adhesive member 220, like the second adhesive member 110, may be formed as a double-sided tape. In an embodiment, the polarizing film 230 may include a first polarizing film 231 and a second polarizing film 232, which is spaced apart from the first polarizing film 231.

The polarizing film 230 may be disposed in the main area MA and the sub-area SA of the display panel 210, but not in the bending area BA of the display panel 210, to expose the first surface of the bending area BA. Although not specifically illustrated, a light phase retardation film may be further disposed on a first surface or a second surface of the polarizing film 230. The light phase retardation film may be a quarter-wave plate. In an embodiment, the light phase retardation film may be disposed on a first surface of the first polarizing film 231, but not on a first surface of the second polarizing film 232.

The polarizing film 230 may prevent or substantially prevent the reflection of external light by selectively transmitting therethrough, and/or absorbing, light incident from the outside of the display device 1. In an exemplary embodiment, the polarizing film 230 may be an absorptive polarizing film. The polarizing film 230 may include a flexible material, such as polyvinyl alcohol (PVA). The polarizing film 230 may have an absorption axis in one direction. The polarizing film 230 may have an absorptive polarization characteristic for polarization components vibrating in a direction parallel to its absorption axis. The term "absorptive polarization characteristic," as used herein, refers to the characteristic of imparting a polarization property to light by allowing the transmission of polarization components vibrating in a direction parallel to a transmission axis and partially absorbing polarization components vibrating in a direction that crosses the transmission axis. That is, the polarizing film 230 may have an absorptive polarization characteristic for polarization components vibrating in the direction parallel to its absorption axis and may thus absorb polarization components vibrating in the direction parallel to its absorption axis, as illustrated in FIG. 4, but the present disclosure is not limited thereto. The polarizing film 230 may be a reflective polarizing film selectively transmitting therethrough, and/or reflecting, polarization components of external light.

The first polarizing film 231 may be disposed on the first surface of the display panel 210 to overlap with the main area MA in the thickness direction, but the present disclosure is not limited thereto. In an embodiment, the first polarization film 231 may extend over to the bending area BA and may overlap with the bending area BA in the thickness direction. The second polarizing film 232 may be disposed on the first surface of the display panel 210 to overlap with the sub-area SA in the thickness direction, but the present disclosure is not limited thereto. In an embodiment, the second polarization film 232 may extend over to the bending area BA and may overlap with the bending area BA in the thickness direction. The first and second polarizing films 231 and 232 may face each other.

The first polarizing film 231 not only can prevent or substantially prevent the reflection of external light by selectively transmitting therethrough, and/or absorbing, light incident from the outside of the display device 1, but also may maintain the flatness of the display panel 210 by being disposed on the first surface of the main area MA of the display panel 210 to support the display panel 210. On the other hand, the second polarizing film 232, unlike the first polarizing film 231, may not prevent the reflection of external light. However, the second polarizing film 232 may be formed of the same film as the first polarizing film 231 and may maintain the flatness of the display panel 210, like the first polarizing film 231, by being disposed in the sub-area SA of the display panel 210.

The first adhesive member 220 includes the first adhesive film 221, which is disposed between, and bonds together, the first surface of the main area MA of the display panel 210 and a second surface of the first polarizing film 231, and the second adhesive film 222, which is disposed between, and bonds together, the first surface of the sub-area SA of the display panel 210 and a second surface of the second polarizing film 232. In the main area MA, the second surface of the first polarizing film 231 may be attached to the first surface of the display panel 210 via the first adhesive film 221, and in the sub-area SA, the second surface of the second polarizing film 232 may be attached to the first surface of the display panel 210 via the second adhesive film 222. In an embodiment, the first and second polarizing films 231 and 232 may be disposed in a same layer and may include a same material.

In an exemplary embodiment, the passivation film 240 may be further disposed in the bending area BA, particularly, on the part of the first surface of the display panel 210 exposed by the polarizing film 230. The passivation film 240 may be disposed on the first surface of the bending area BA of the display panel 210. The passivation film 240 may be bent to surround, from the outside, the first surface of the bending area BA of the display panel 210. One side of the passivation film 240 may be adjacent to sides of the first polarizing film 231 and the first adhesive film 221, and the other side of the passivation film 240 may be adjacent to sides of the second polarizing film 232 and the second adhesive film 222. However, the present disclosure is not limited to this. Alternatively, both sides of the passivation film 240 may not be in contact with the sides of the first and second polarizing films 231 and 232 and the sides of the first and second adhesive films 221 and 222.

When the display panel 210 including the base substrate 211 is bent, the passivation film 240 may be disposed on the first surface of the display panel 210 to reinforce the strength of the display panel 210, to alleviate stress of the bending area BA, and, thus, to prevent or substantially prevent damage to the display device 1. For example, the passivation film 240 may include an acrylic resin or a silicone-based resin and may further include polymer-based fine particles, such as rubber including silica, epoxy, an epoxy hybrid, or the like. The passivation layer 240 may be formed by a coating method, but the present disclosure is not limited thereto. Alternatively, the passivation film 240 may be formed by attaching a single film or a stack of films including PET. In one or more exemplary embodiments, the passivation film 240 may cover the sides of the first and second polarizing films 231 and 232 and/or the first surfaces of the first and second polarizing films 231 and 232.

The data driver integrated circuit 250 may be connected to the pad terminals on the part of the sub-area SA that is distant from the bending area BA and exposed by the polarizing film 230. In an exemplary embodiment, a data driver chip may be used as the data driver integrated circuit 250. In an embodiment, the data driver chip 250 may be mounted directly on a flexible substrate in a chip-on-plastic (COP) manner. As illustrated in FIG. 4, the data driver chip 250 may be disposed adjacent to the second polarizing film 232 and the second adhesive film 222 and may be placed in contact with the sides of the second polarizing film 232 and the second adhesive film 222. However, in one or more exemplary embodiments, the data driver chip 250 may have a first surface and sides covered by the polarizing film 230, particularly, the second polarizing film 232, and may have a second surface placed in contact with the first surface of the second polarizing film 232. In an embodiment, the data driver chip 250 may be attached to the first surface of the display panel 210 via a flexible film in a chip-on-film (COF) manner.

As described above, the display panel 210 may include generally flat areas, i.e., the main area MA and the sub-area SA, and a non-flat area disposed between the main area MA and the sub-area SA, i.e., the bending area BA. In order to maintain the flatness of the flat areas of the display panel 210, a supporting structure may be disposed on first or second surfaces of the flat areas of the display panel 210, i.e., the first or second surfaces of the main area MA and the sub-area SA. However, if the supporting structure is disposed on the first surface of the display panel 210, the transmission of light emitted from the display panel 210 may be interfered with, and as a result, the emission efficiency of the display device 1 may be lowered. On the other hand, if the supporting structure is disposed on the second surface of the display panel 210, the total thickness of the display device 1 may increase due to the thickness of the supporting structure, and, as a result, dead space may increase in the display device 1. Accordingly, the emission efficiency of the display device 1 may also be lowered.

According to the display device 1, the polarizing film 230 is disposed on the first surface of the main area MA and the sub-area SA and may thus support the flat areas of the display panel 210. In this case, the general thickness and dead space of the display device 1 may be considerably reduced. In addition, a process for forming a separate structure on the second surface of the display panel 210 may be omitted, and, as a result, process efficiency may be improved.

Other exemplary embodiments of the present disclosure will hereinafter be described. In the previous and subsequent exemplary embodiments, like reference numerals indicate like elements, and, thus, descriptions thereof may be omitted or simplified.

Figure 5:
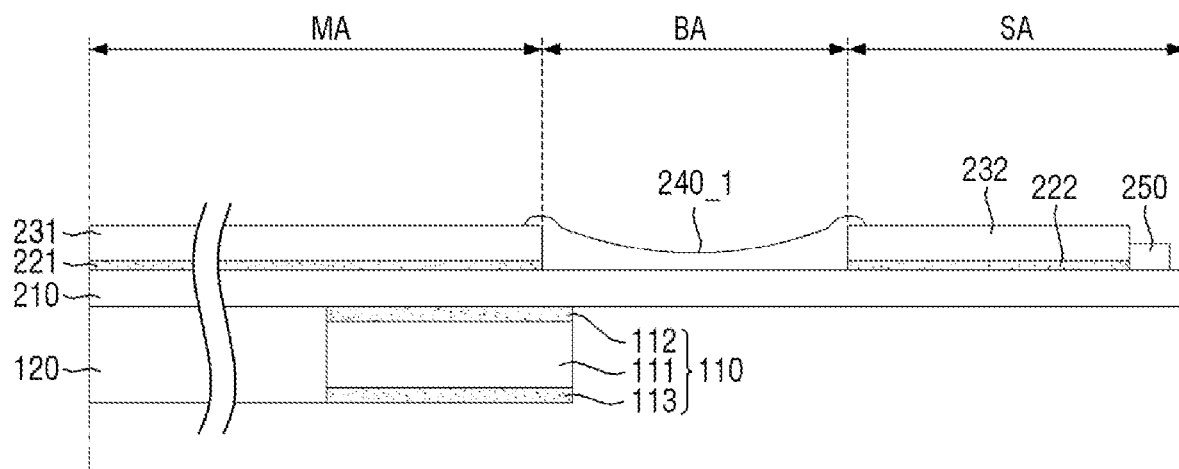
FIG. 5 is a cross-sectional view of a display device according to another exemplary embodiment of the present disclosure.
Figure 5:
Figure 6:
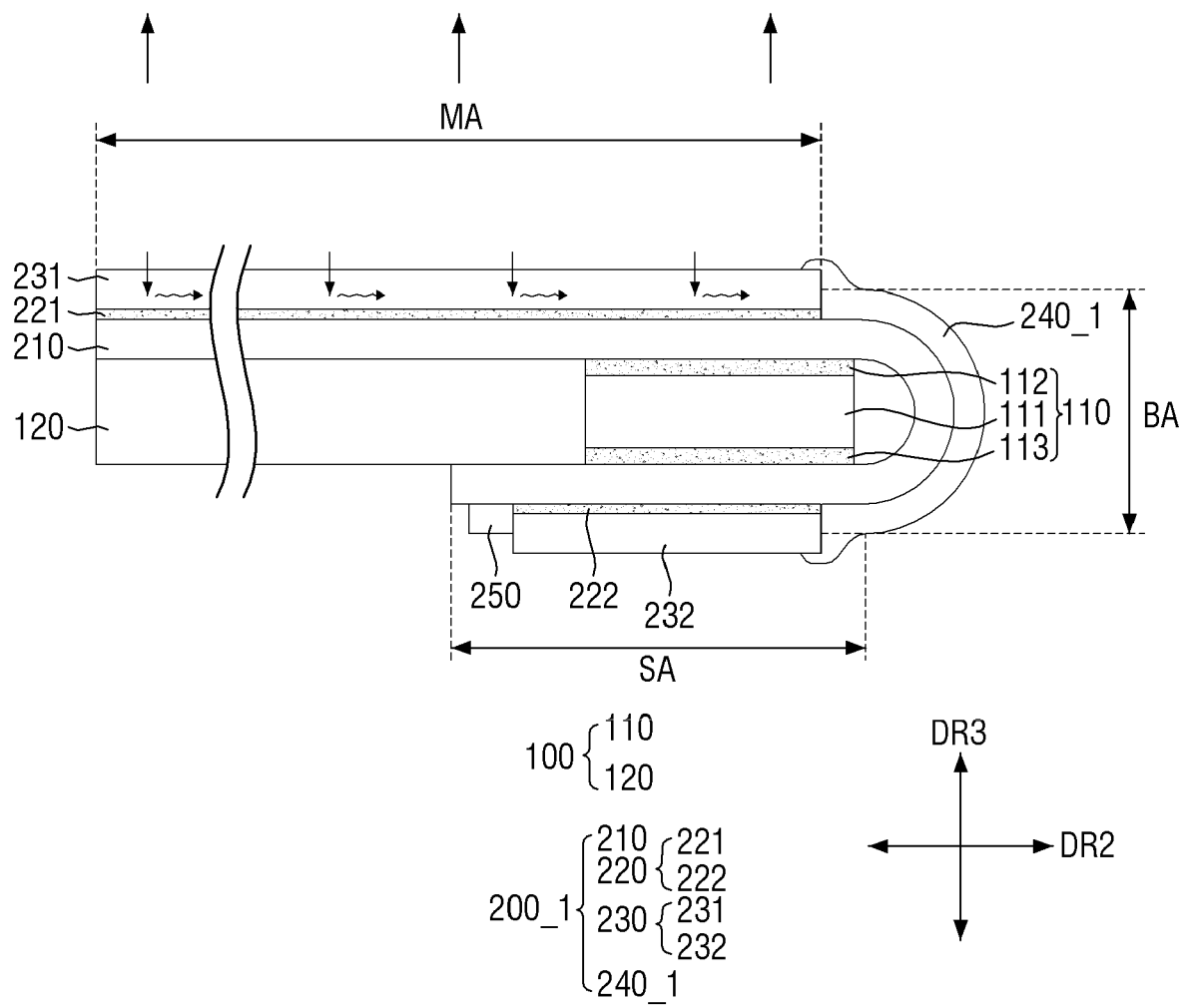
FIG. 6 is a cross-sectional view illustrating the display device of FIG. 5 in a bent state.

FIG. 5 is a cross-sectional view of a display device according to another exemplary embodiment of the present disclosure; and FIG. 6 is a cross-sectional view illustrating the display device of FIG. 5 in a bent state.

Referring to FIGS. 5 and 6, a display device 2 differs from the display device 1 of FIGS. 1 through 4 in that a passivation film 240_1 of a display module 200_1 extends over to, and covers, not only the adjacent sides of first and second polarizing films 231 and 232, but also parts of the first surfaces of the first and second polarizing films 231 and 232.

The passivation film 240_1 may cover the side of the first polarizing film 231 that is aligned with the boundary between a bending area BA and a main area MA and a part of the first surface of the first polarizing film 231. Also, the passivation film 240_1 may cover the side of the second polarizing film 232 that is aligned with the boundary between the bending area BA and a sub-area SA and a part of the first surface of the second polarizing film 232. The sides of first and second polarizing films may be impacted by foreign materials in the display device or may be damaged by external shock. Also, the first and second polarizing films may be peeled off of a display panel due to external shock and bending tension. However, since the passivation film 240_1 extends over to, and covers, not only the adjacent sides of the first and second polarizing films 231 and 232, but also parts of the first surfaces of the first and second polarizing films 231 and 232, the passivation film 240_1 can prevent or substantially prevent the first and second polarizing films 231 and 232 from being peeled off of the display panel 210 and can protect the sides and the first surfaces of the first and second polarizing films 231 and 232 against external shock and foreign materials.

Figure 7:
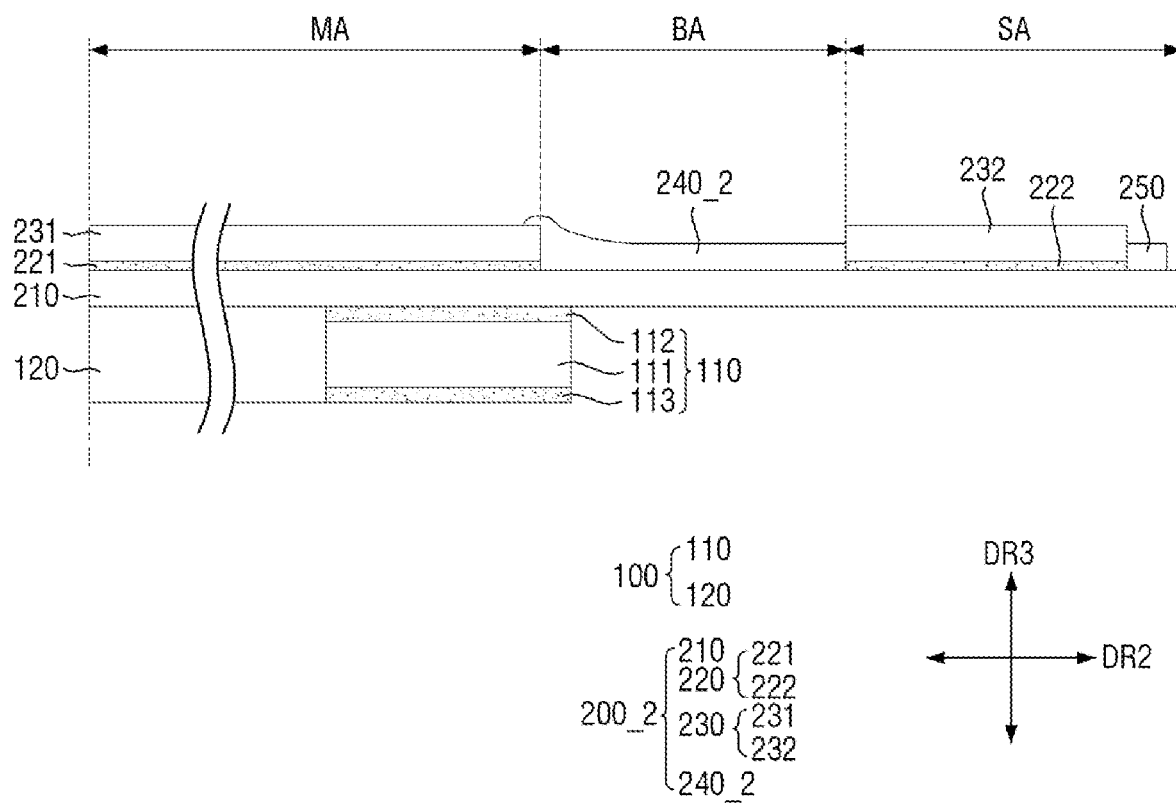
FIG. 7 is a cross-sectional view of a display device according to another exemplary embodiment of the present disclosure.
Figure 8:
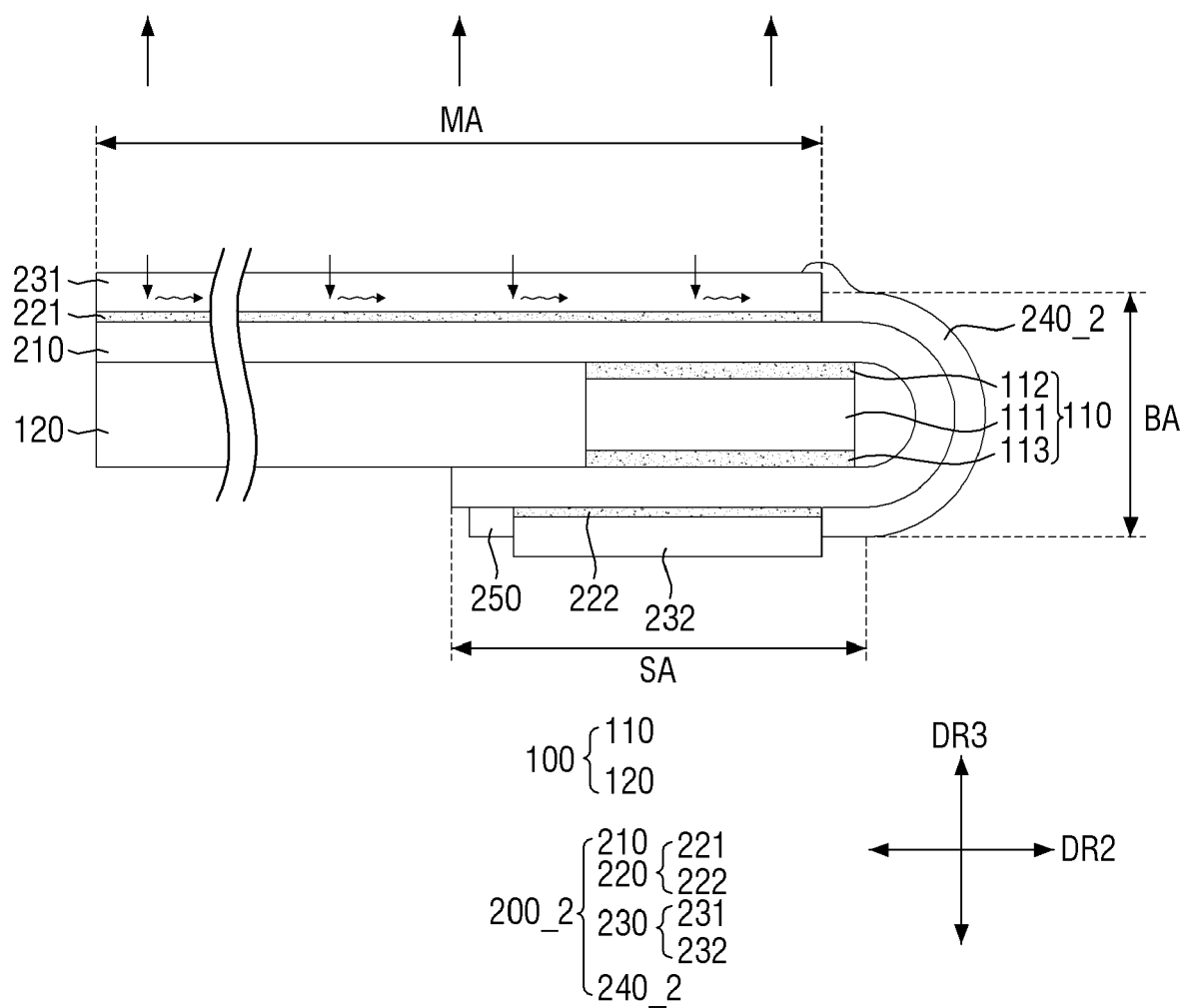
FIG. 8 is a cross-sectional view illustrating the display device of FIG. 7 in a bent state.

FIG. 7 is a cross-sectional view of a display device according to another exemplary embodiment of the present disclosure; and FIG. 8 is a cross-sectional view illustrating the display device of FIG. 7 in a bent state.

Referring to FIGS. 7 and 8, a display device 3 differs from the display device 2 of FIGS. 5 and 6 in that a passivation film 240_2 of a display module 200_2 extends over to, and covers, not only the adjacent side of a first polarizing film 231, but also a part of a first surface of the first polarizing film 231.

The passivation film 240_2 may cover the side of the first polarizing film 231 that is aligned with the boundary between a bending area BA and a main area MA and a part of the first surface of the first polarizing film 231. Since the passivation film 240_2 extends over to, and covers, not only the adjacent side of the first polarizing film 231, but also a part of the first surface of the first polarizing film 231, the passivation film 240_2 can prevent or substantially prevent the first polarizing film 231 from being peeled off of a display panel 210 and can protect the side and the first surface of the first polarizing film 231 against external shock and foreign materials.

Figure 9:
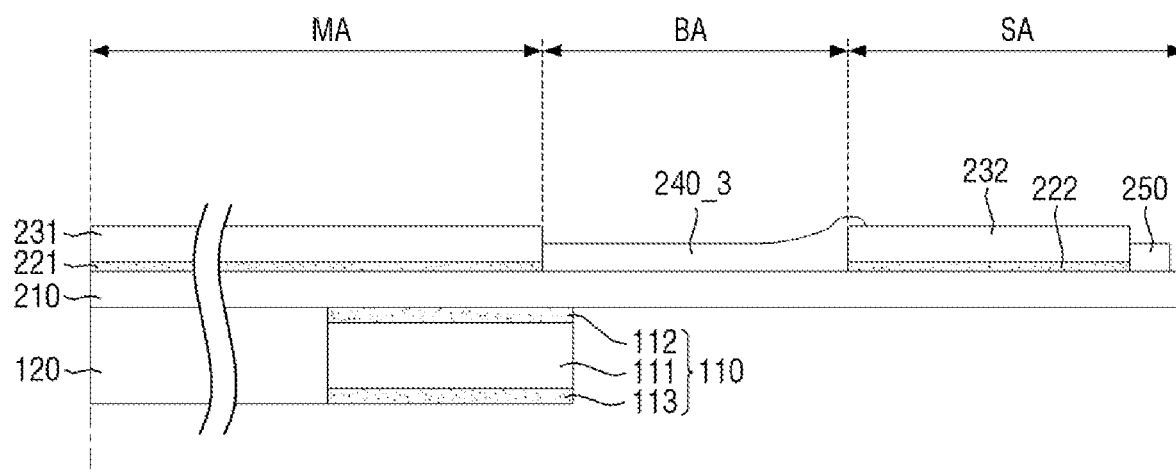
FIG. 9 is a cross-sectional view of a display device according to another exemplary embodiment of the present disclosure.
Figure 9:
Figure 10:
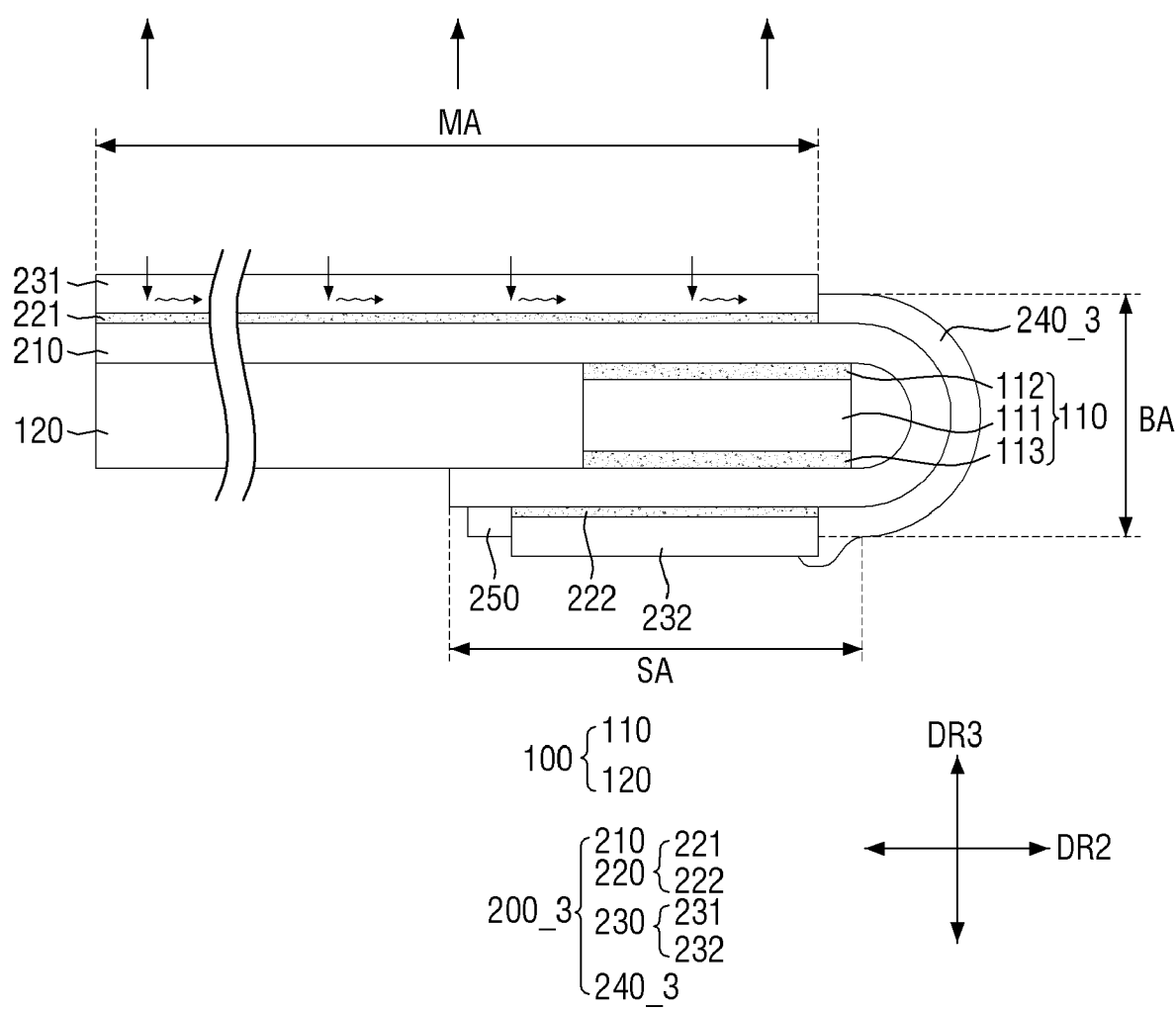
FIG. 10 is a cross-sectional view illustrating the display device of FIG. 9 in a bent state.

FIG. 9 is a cross-sectional view of a display device according to another exemplary embodiment of the present disclosure; and FIG. 10 is a cross-sectional view illustrating the display device of FIG. 9 in a bent state.

Referring to FIGS. 9 and 10, a display device 4 differs from the display device 2 of FIGS. 5 and 6 in that a passivation film 240_3 of a display module 200_3 extends over to, and covers, not only the adjacent side of a second polarizing film 232, but also a part of a first surface of the second polarizing film 232.

The passivation film 240_3 may cover the adjacent side of the second polarizing film 232 that is aligned with the boundary between a bending area BA and a sub-area SA and a part of the first surface of the second polarizing film 232. Since the passivation film 240_3 extends over to, and covers, not only the side of the second polarizing film 232, but also a part of the first surface of the second polarizing film 232, the passivation film 240_3 can prevent or substantially prevent the second polarizing film 232 from being peeled off of a display panel 210 and can protect the side and the first surface of the second polarizing film 232 against external shock and foreign materials.

Figure 11:
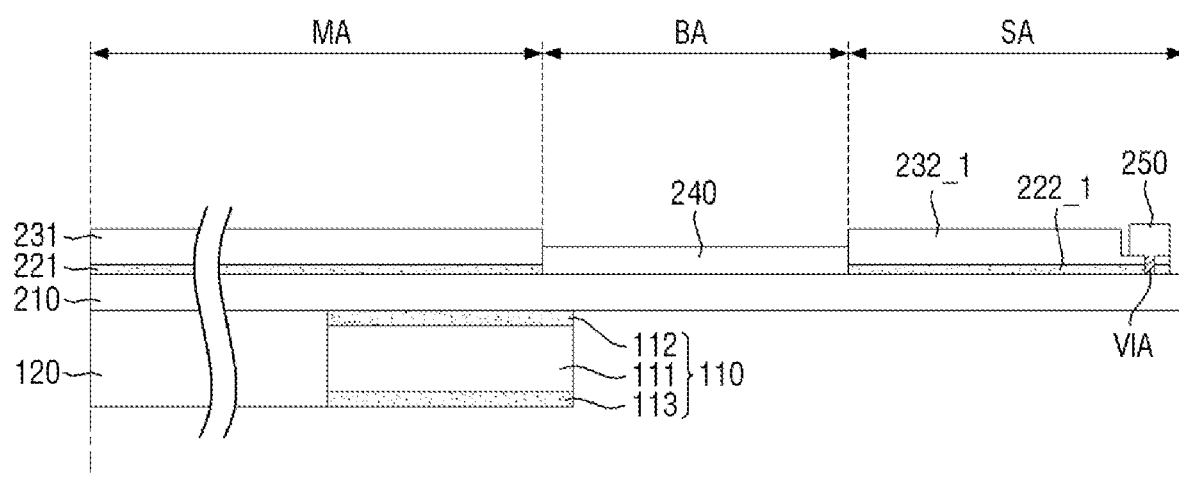
FIG. 11 is a cross-sectional view of a display device according to another exemplary embodiment of the present disclosure.
Figure 12:
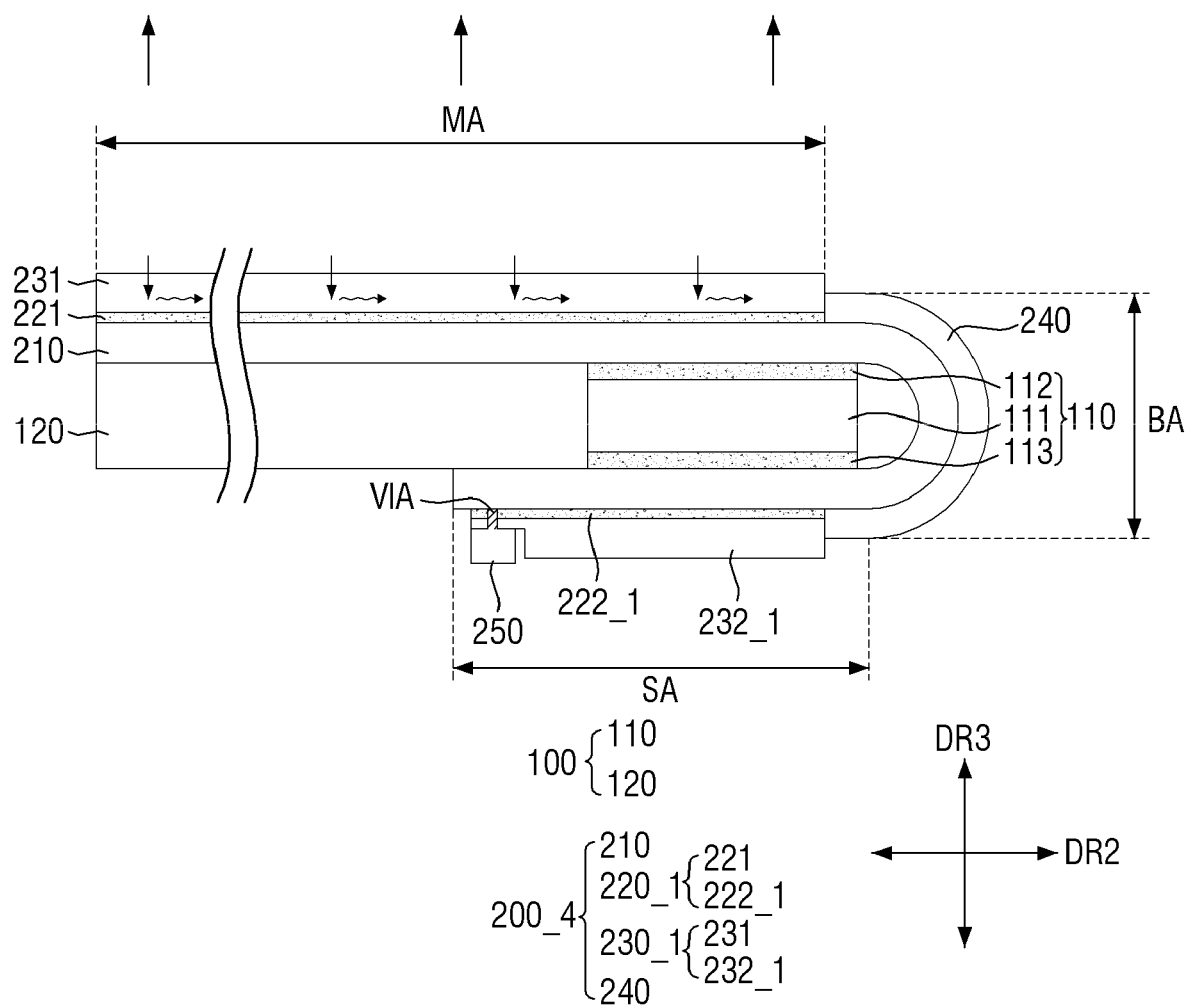
FIG. 12 is a cross-sectional view illustrating the display device of FIG. 11 in a bent state.

FIG. 11 is a cross-sectional view of a display device according to another exemplary embodiment of the present disclosure; and FIG. 12 is a cross-sectional view illustrating the display device of FIG. 11 in a bent state.

Referring to FIGS. 11 and 12, a display device 5 differs from the display device 1 of FIGS. 1 through 4 in that, in a display module 200_4, a second polarizing film 232_1 of a polarizing film 230_1 and a second adhesive film 222_1 of a first adhesive member 220_1 extend to an end portion of a sub-area SA, and that a data driver chip 250 is disposed on a first surface of the second polarizing film 232_1.

The second polarizing film 232_1 and the second adhesive film 222_1 may extend to an end portion of the sub-area SA. In this case, the area of the second polarizing film 232_1 for supporting the sub-area SA of a display panel 210 can be widened, and, as a result, the flatness of the display panel 210 can be further enhanced. The second polarizing film 232_1 and the second adhesive film 222_1 may include a via hole VIA. The data driver chip 250 may be connected to a connecting portion of the display panel 210 via the via hole VIA.

Figure 13:
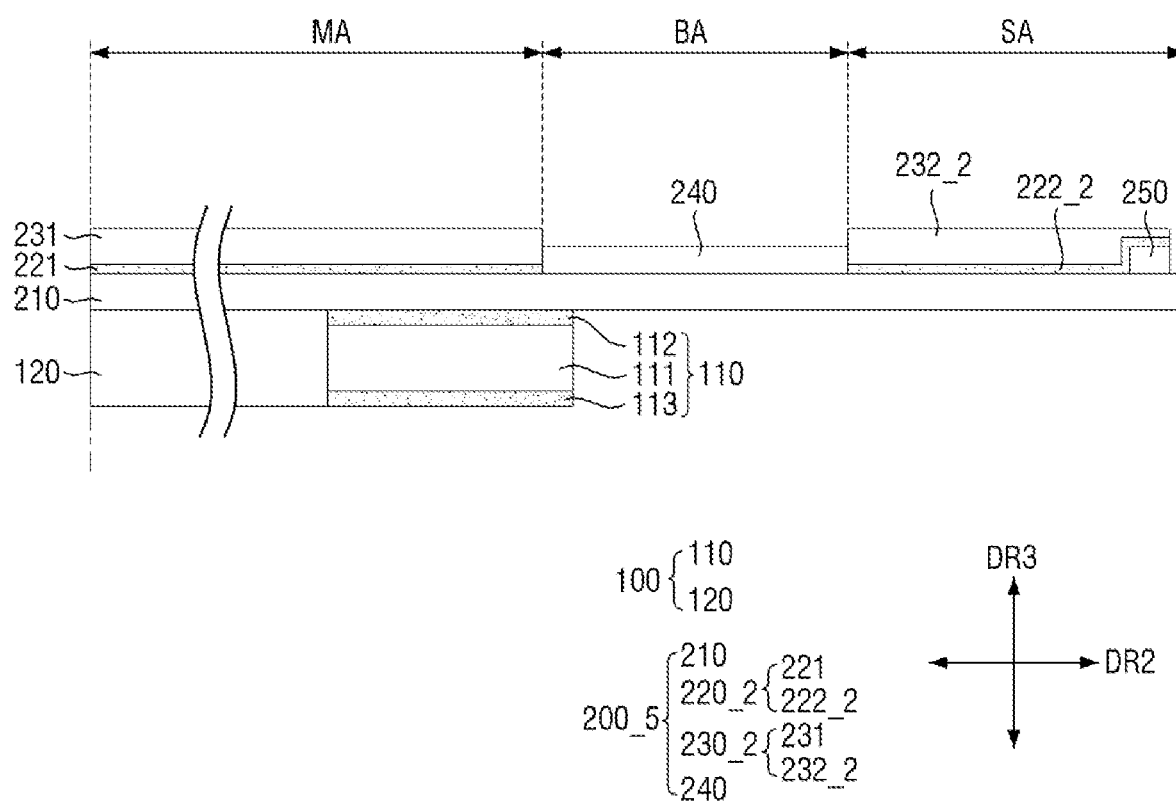
FIG. 13 is a cross-sectional view of a display device according to another exemplary embodiment of the present disclosure.
Figure 14:
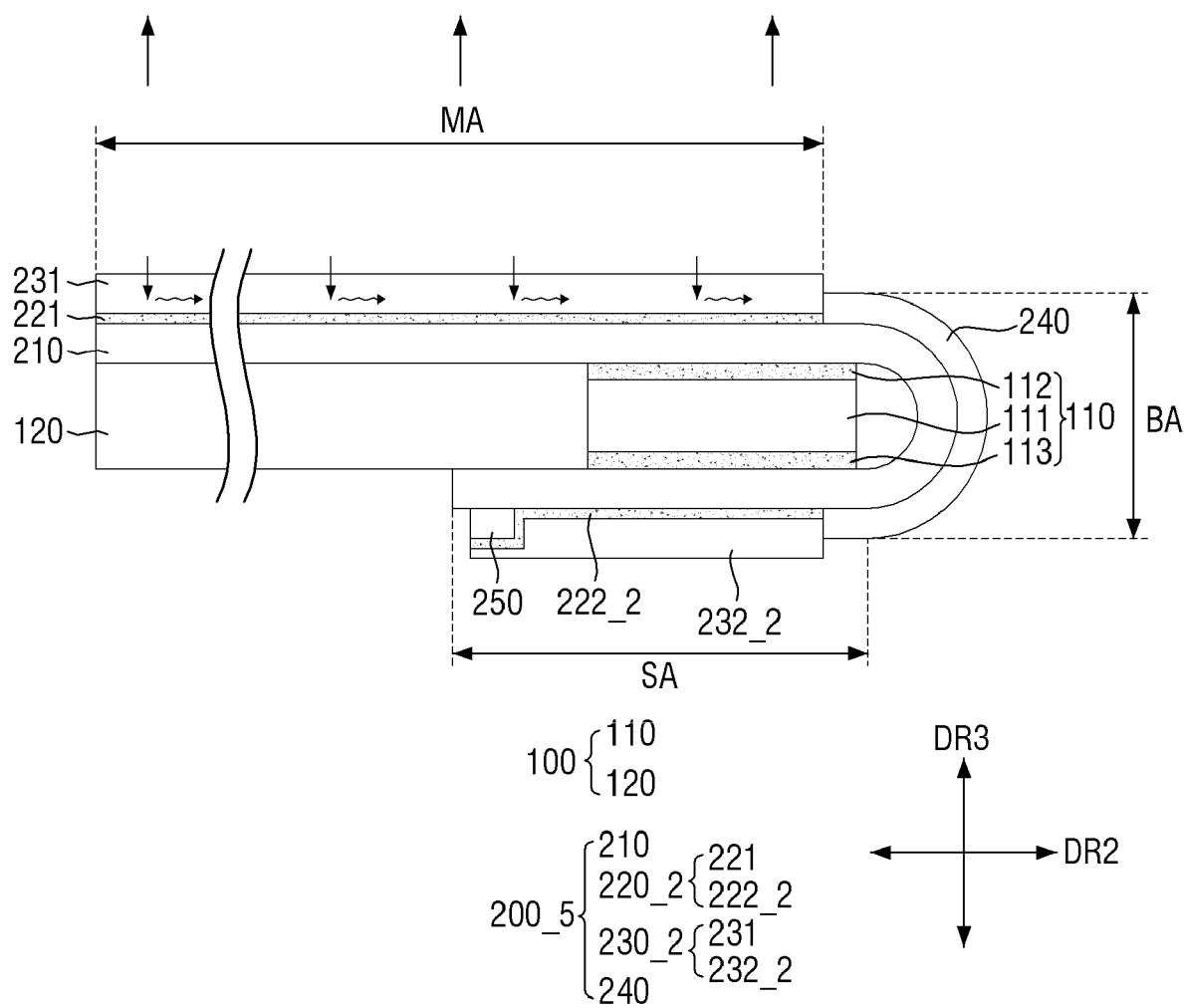
FIG. 14 is a cross-sectional view illustrating the display device of FIG. 13 in a bent state.

FIG. 13 is a cross-sectional view of a display device according to another exemplary embodiment of the present disclosure; and FIG. 14 is a cross-sectional view illustrating the display device of FIG. 13 in a bent state.

Referring to FIGS. 13 and 14, a display device 6 differs from the display device 1 of FIGS. 1 through 4 in that, in a display module 200_5, a second polarizing film 232_2 of a polarizing film 230_2 and a second adhesive film 222_2 of a first adhesive member 220_2 extend to an end portion of a sub-area SA to cover a first surface of a data driver chip 250.

The second polarizing film 232_2 and the second adhesive film 222_2 may extend to an end portion of the sub-area SA. The second polarizing film 232_2 and the second adhesive film 222_2 may cover the first surface of the data driver chip 250.

The thickness of a part of the second polarizing film 232_2 that overlaps with the data driver chip 250 may differ from the thickness of a part of the second polarizing film 232_2 in the sub-area SA where the data driver chip 250 is not disposed, but the present disclosure is not limited thereto. In an embodiment, a first surface of the second polarizing film 232_2 may protrude in a thickness direction, for example, a third direction DR3, in an area where the second polarizing film 232_2 overlaps with the data driver chip 250 more than in an area where the data driver chip 250 is not disposed, but the present disclosure is not limited thereto. According to the exemplary embodiment of FIGS. 13 and 14, since the second polarizing film 232_2 covers the first surface of the data driver chip 250, damage to the data driver chip 250 caused by external shock or foreign materials can be minimized or reduced.

Figure 15:
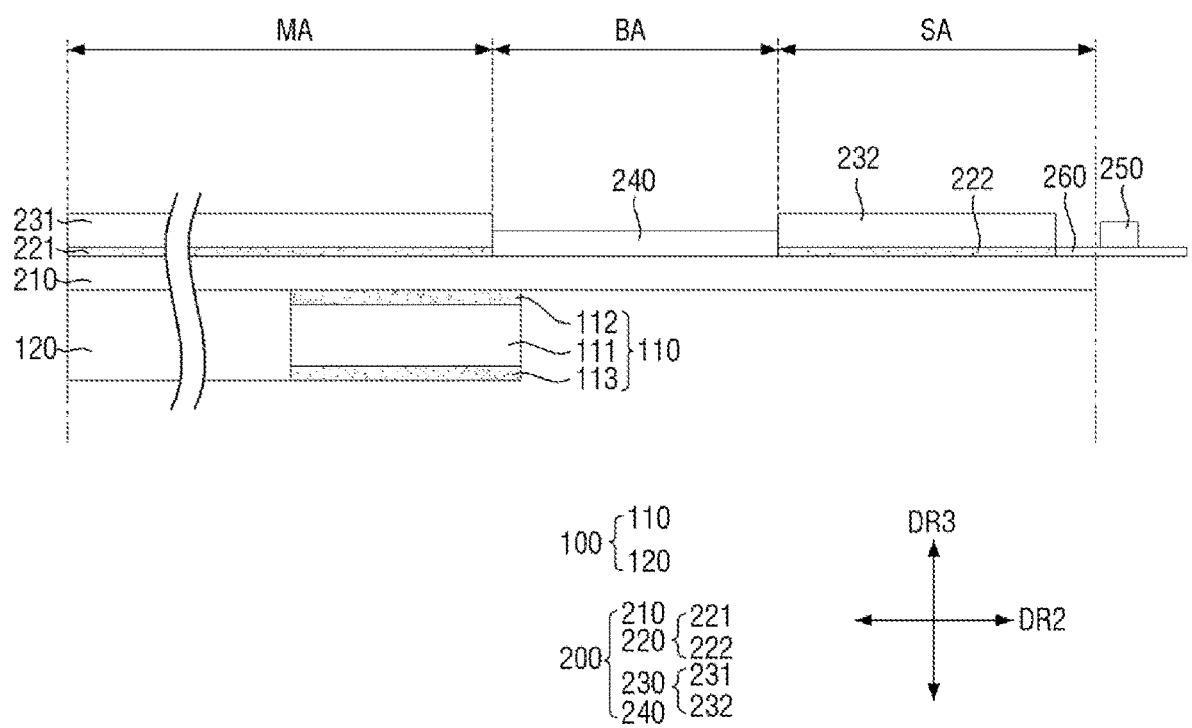
FIG. 15 is a cross-sectional view of a display device according to another exemplary embodiment of the present disclosure.
Figure 16:
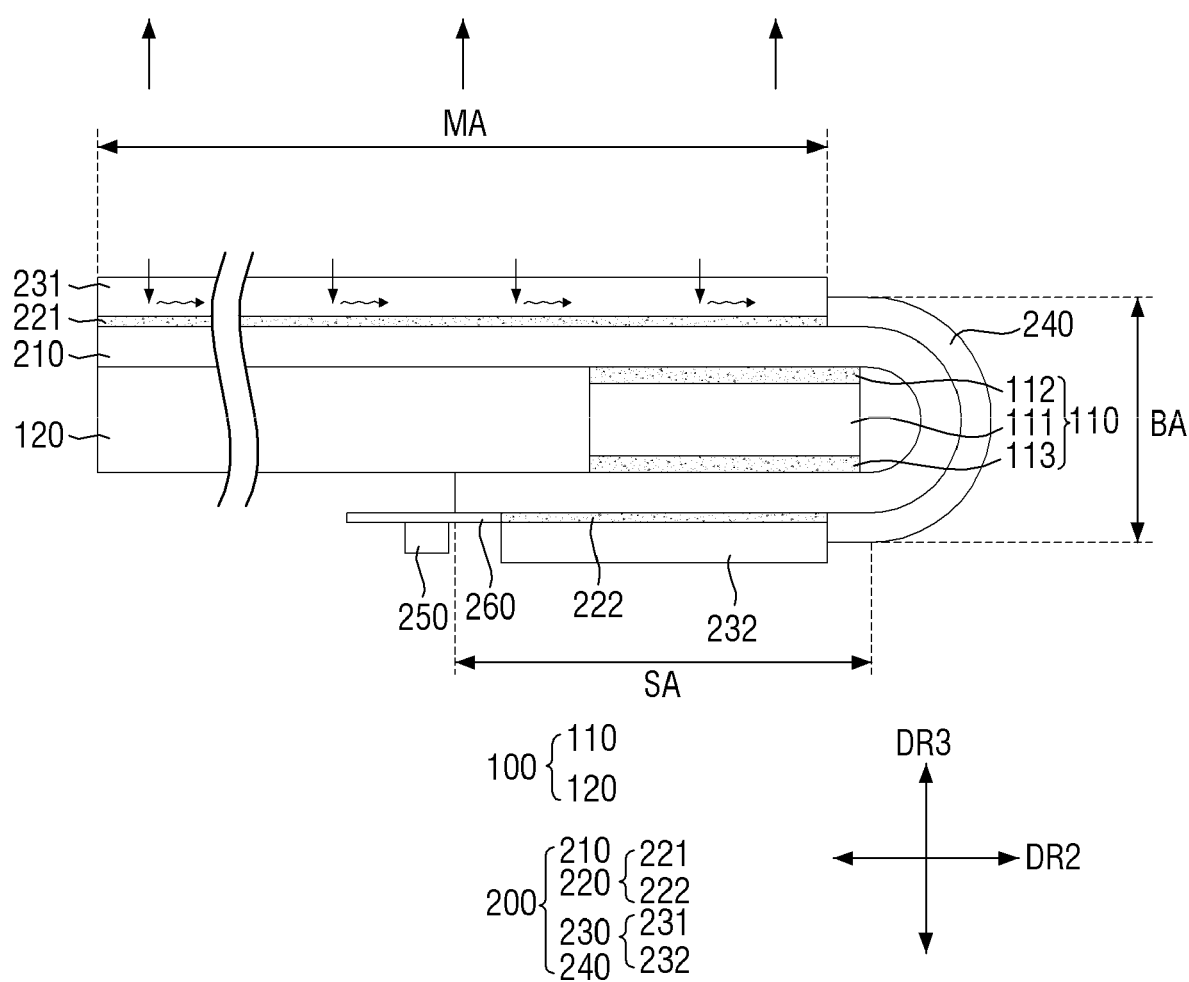
FIG. 16 is a cross-sectional view illustrating the display device of FIG. 15 in a bent state.

FIG. 15 is a cross-sectional view of a display device according to another exemplary embodiment of the present disclosure; and FIG. 16 is a cross-sectional view illustrating the display device of FIG. 15 in a bent state.

Referring to FIGS. 15 and 16, a display device 7 differs from the display device 1 of FIGS. 1 through 4 in that a data driver chip 250 is provided as a COF and is attached to a first surface of a display panel 210 via a flexible film 260.

The flexible film 260 may be attached to one side of a display panel 210. Although not specifically illustrated, a printed circuit board may be attached to a side of the flexible film 260. The data driver chip 250 may be provided as a COF and may be electrically connected to the display panel 210 via the flexible film 260, which is attached to a side of the display panel 210. In an embodiment, a timing controller generating signals to be transmitted to the data driver chip 250, which is mounted on the flexible film 260, may be mounted on the printed circuit board.

Figure 17:
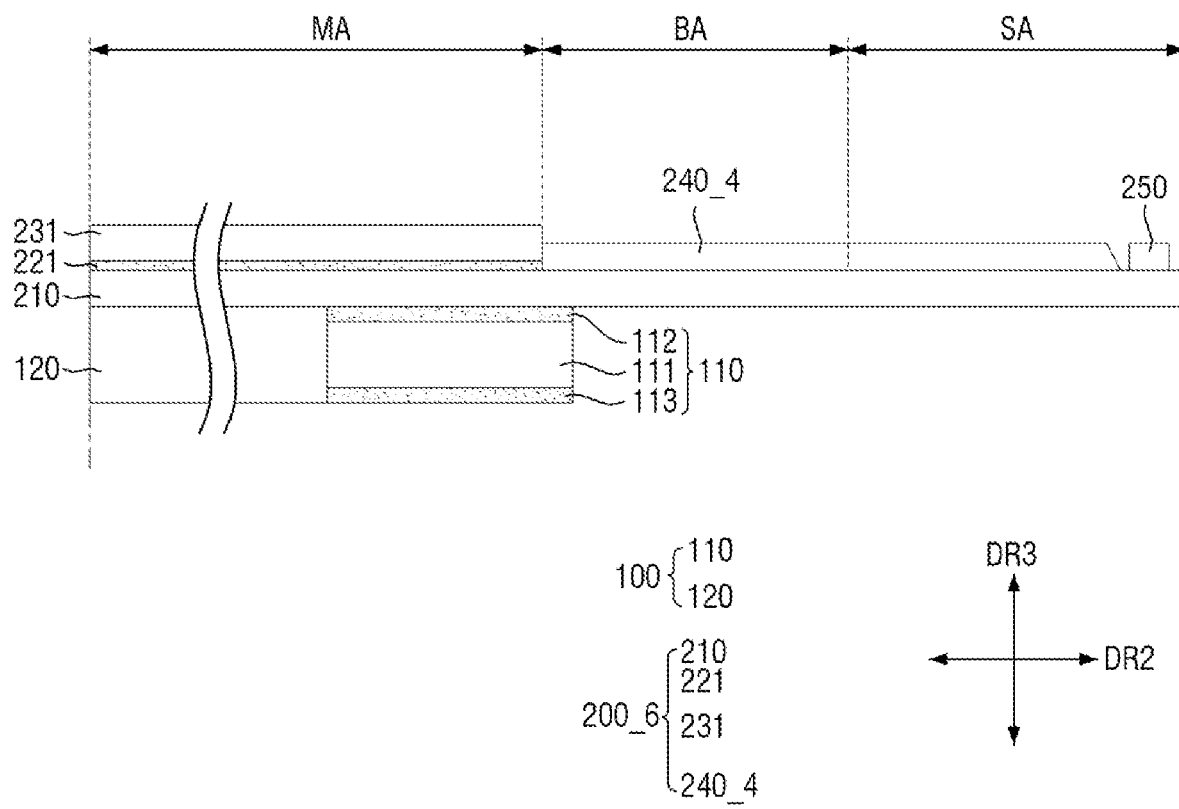
FIG. 17 is a cross-sectional view of a display device according to another exemplary embodiment of the present disclosure.
Figure 18:
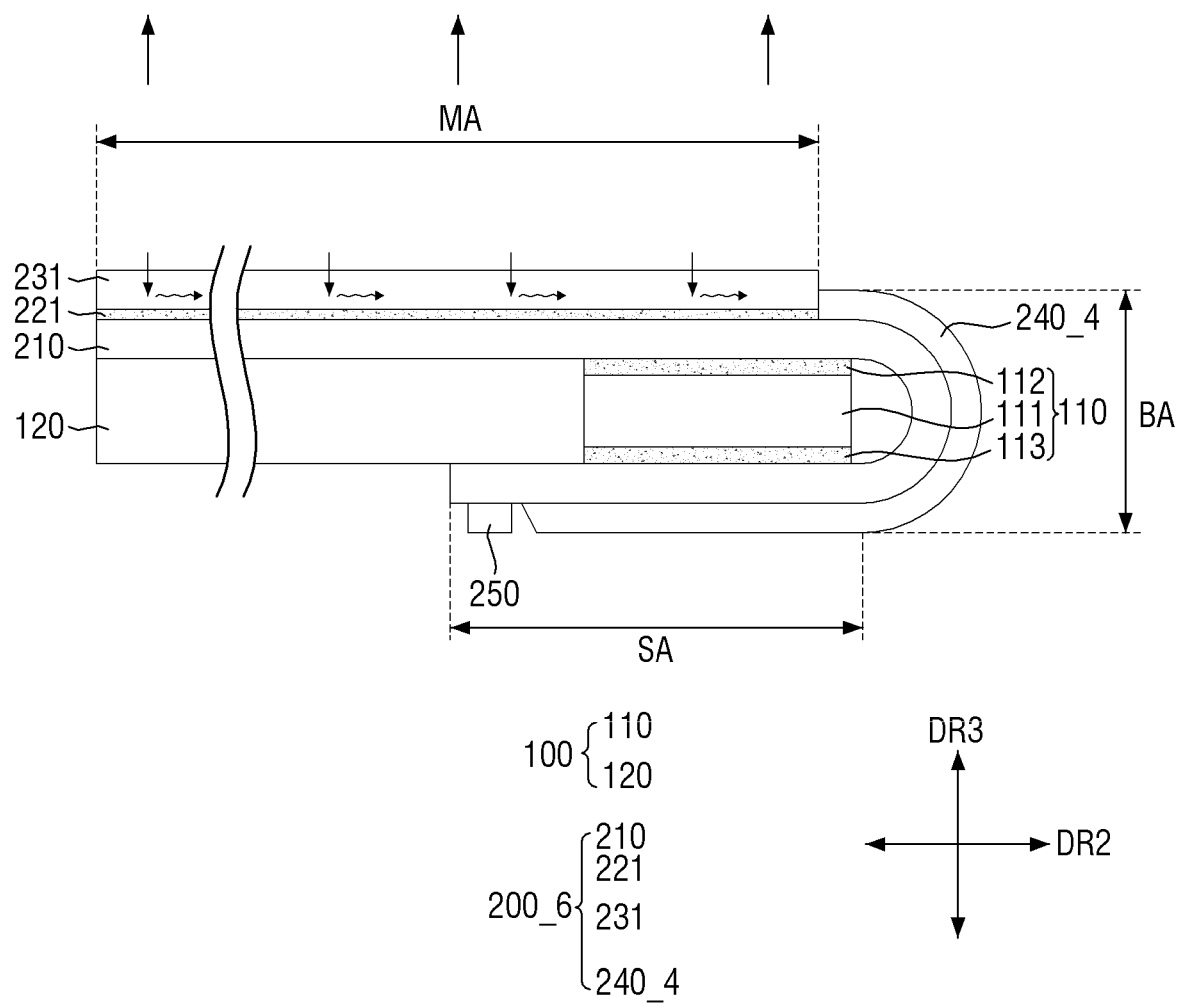
FIG. 18 is a cross-sectional view illustrating the display device of FIG. 17 in a bent state.

FIG. 17 is a cross-sectional view of a display device according to another exemplary embodiment of the present disclosure; and FIG. 18 is a cross-sectional view illustrating the display device of FIG. 17 in a bent state.

Referring to FIGS. 17 and 18, a display device 8 differs from the display device 1 of FIGS. 1 through 4 in that there exists no second polarizing film 232, and a passivation film 240_4 of a display module 200_6 is disposed on a first surface of a bending area BA of a display panel 210 and on a part of a first surface of a sub-area SA of the display panel 210.

The passivation film 240_4 may be disposed on the first surface of the bending area BA of the display panel 210 and on a part of the first surface of the sub-area SA of the display panel 210. In an embodiment, a passivation film 240_4 having a uniform modulus is disposed on the first surface of the bending area BA of the display panel 210 and on a part of the first surface of the sub-area SA of the display panel 210, but the present disclosure is not limited thereto. In another example, the modulus of the passivation film 240_4 may be greater on the first surface of the bending area BA than on the first surface of the sub-area SA, in which case, as the display device 8 is bent, the passivation film 240_4 which is disposed on the first surface of the display panel 210, can be bent in the bending area BA without bending stress because of its relatively large modulus in the bending area BA and can maintain the flatness of the display panel 210 in the sub-area SA because of its relatively small modulus in the sub-area SA.

Figure 19:
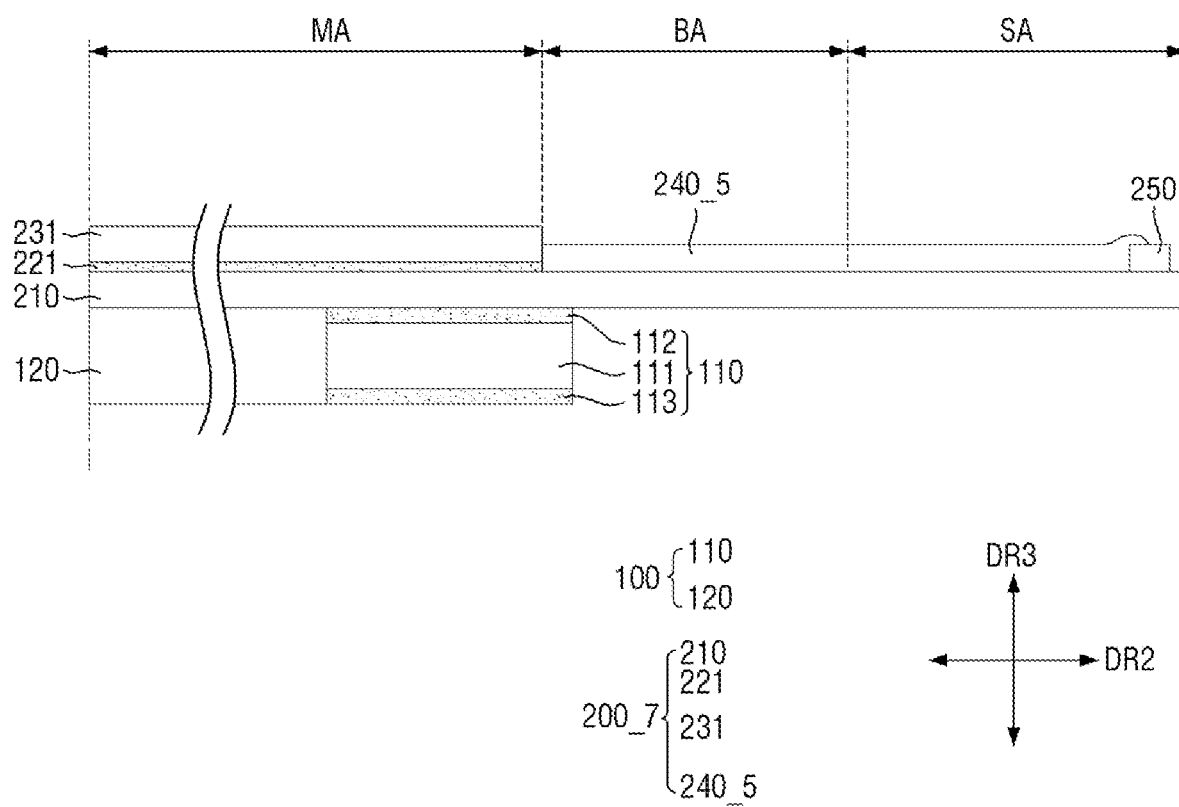
FIG. 19 is a cross-sectional view of a display device according to another exemplary embodiment of the present disclosure.
Figure 20:
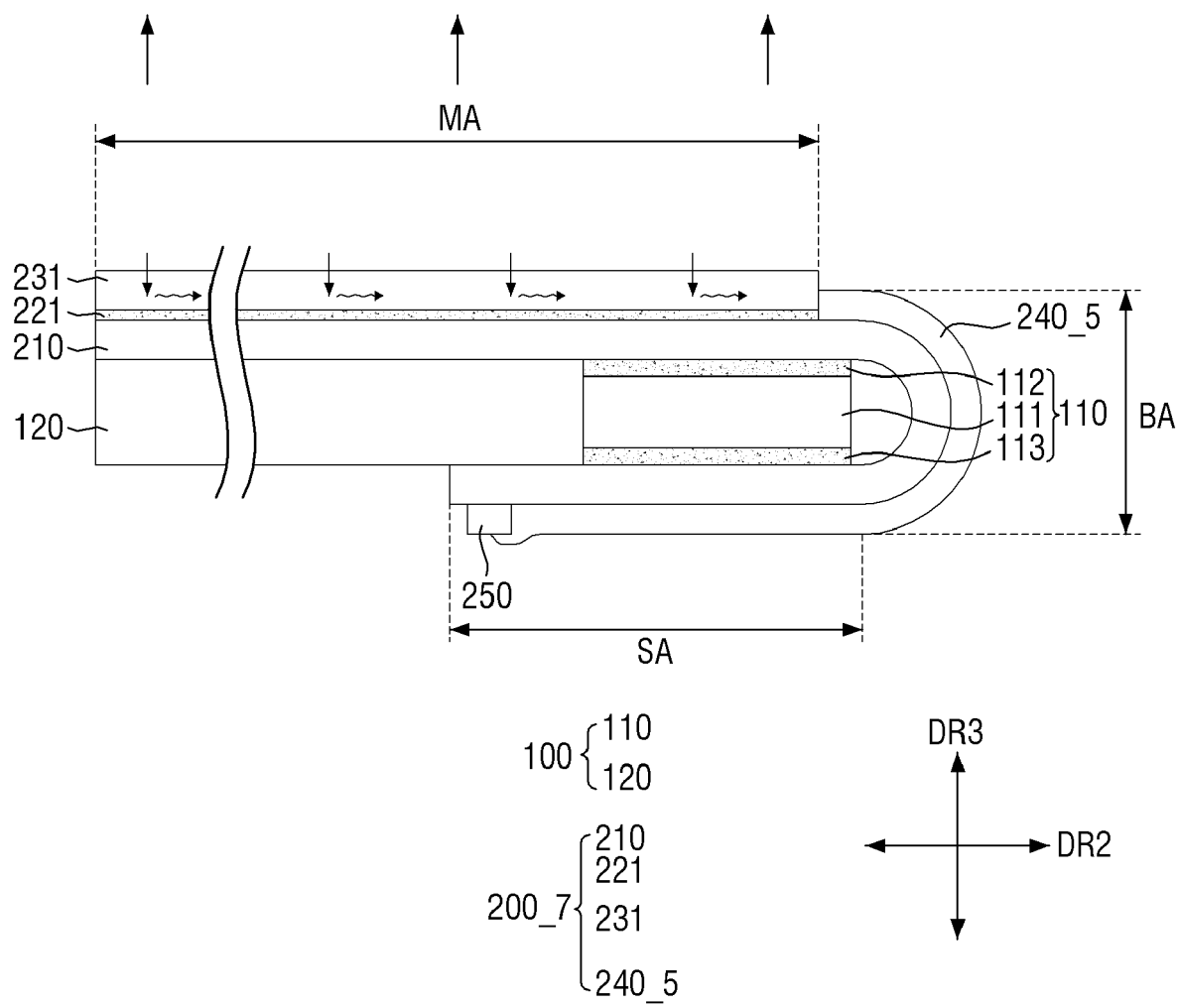
FIG. 20 is a cross-sectional view illustrating the display device of FIG. 19 in a bent state.

FIG. 19 is a cross-sectional view of a display device according to another exemplary embodiment of the present disclosure; and FIG. 20 is a cross-sectional view illustrating the display device of FIG. 19 in a bent state.

Referring to FIGS. 19 and 20, a display device 9 differs from the display device 8 of FIGS. 17 and 18 in that a passivation film 240_5 of a display module 200_7 covers the entire adjacent side of a data driver chip 250, which is disposed in a sub-area SA, and a part of a first surface of the data driver chip 250.

The passivation film 240_5 may cover the entire adjacent side of the data driver chip 250, which is disposed in the sub-area SA, and a part of the first surface of the data driver chip 250. When the data driver chip 250 is not properly bonded to pad terminals (not illustrated) of a display panel 210, the data driver chip 250 may be detached from a first surface of the display panel 210. However, the passivation film 240_5 covers a part of the first surface of the data driver chip 250 and can thus prevent or substantially prevent the data driver chip 250 from being detached from and/or floating off of the first surface of the display panel 210. Also, the passivation film 240_5 covers a side of the data driver chip 250 and can thus prevent or substantially prevent the data driver chip 250 from being damaged by external shock or foreign materials.

The passivation film 240_5 is illustrated as not covering the other side of the data driver chip 250, but the present disclosure is not limited thereto. In an embodiment, the passivation film 240_5 may cover not only the adjacent side and the first surface of the data driver chip 250, but also the other side of the data driver chip 250, and can thus further protect the data driver chip against external shock or foreign materials so as to reduce any possible damage to the data driver chip 250.

Figure 21:
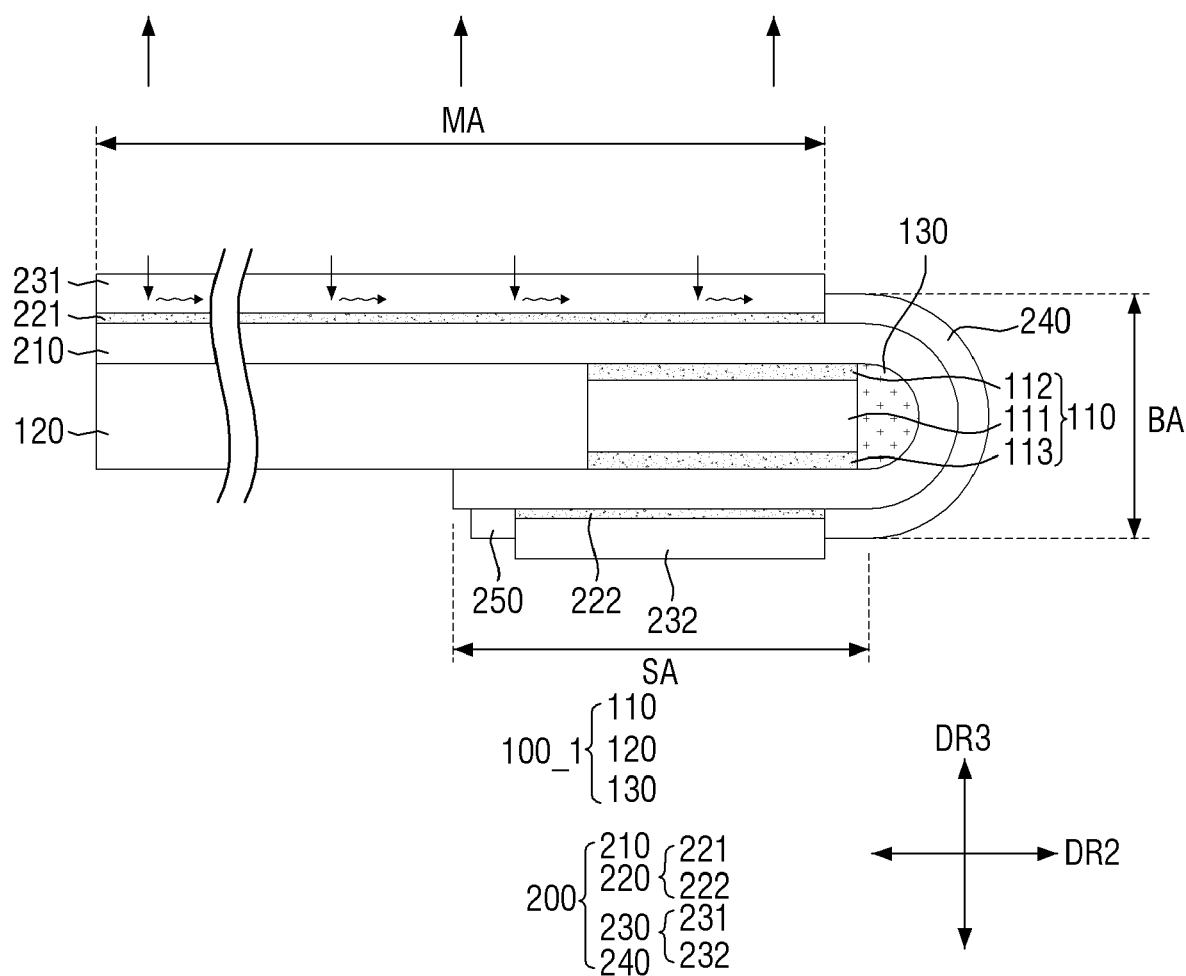
FIG. 21 is a cross-sectional view of a display device according to another exemplary embodiment of the present disclosure, shown in a bent state.

FIG. 21 is a cross-sectional view of a display device according to another exemplary embodiment of the present disclosure, shown in a bent state.

Referring to FIG. 21, a display device 10 differs from the display device 1 of FIGS. 1 through 4 in that a spacer member 130 of a panel bottom structure 100_1 is provided in a gap formed in a bending area BA by a second surface of a display panel 210 and a first adhesive member 110.

The display device 10 may further include the spacer member 130, which is provided in the gap formed in the bending area BA by the second surface of the display panel 210 and the first adhesive member 110. In an embodiment, the spacer member 130 may be a mandrel. The spacer member 130 may be inserted in the gap formed in the bending area BA. Thus, the spacer member 130 can alleviate shock that may be caused to the display panel 210 by stress generated in the bending area BA and external shock, can maintain the curvature of the display panel 210, and can alleviate bending stress to some extent. Also, the spacer member 130 can alleviate shock that may be caused in response to the first adhesive member 110 and the second surface of the display panel 210 being placed in contact with each other in the bending area BA.

Figure 22:
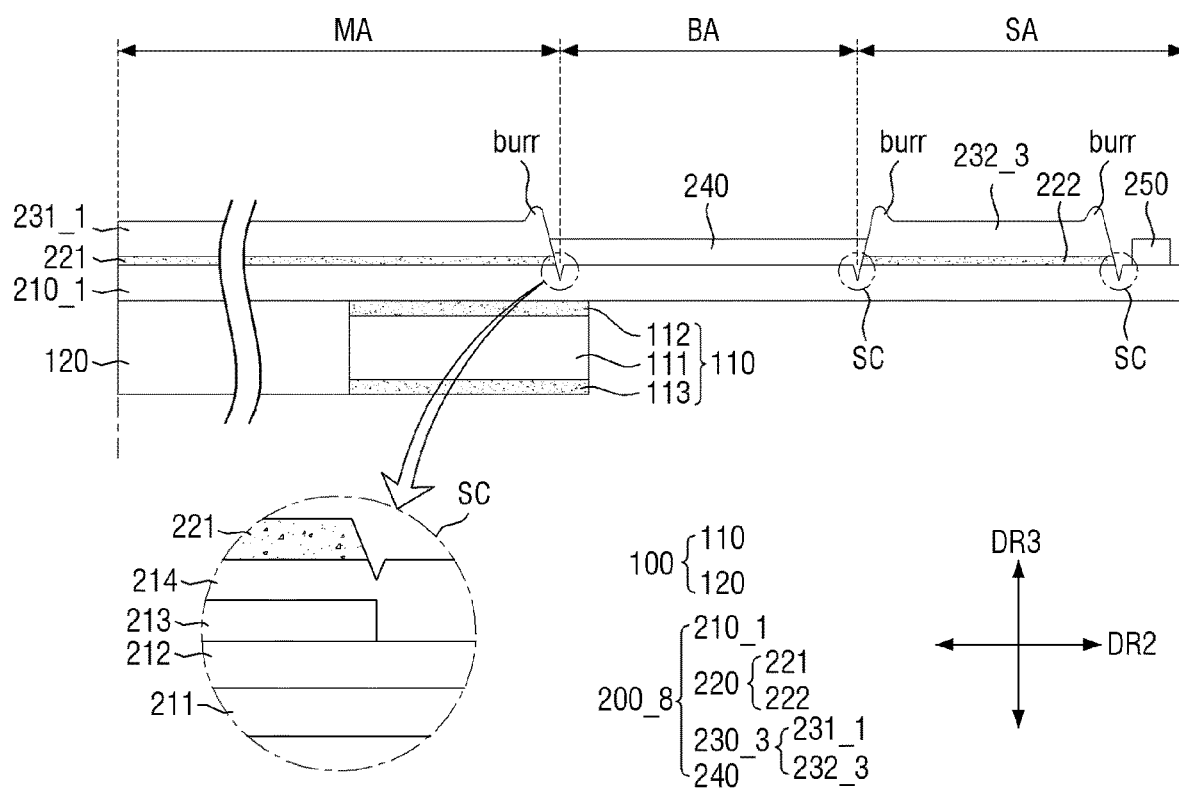
FIG. 22 is a cross-sectional view of a display device according to another exemplary embodiment of the present disclosure.
Figure 23:
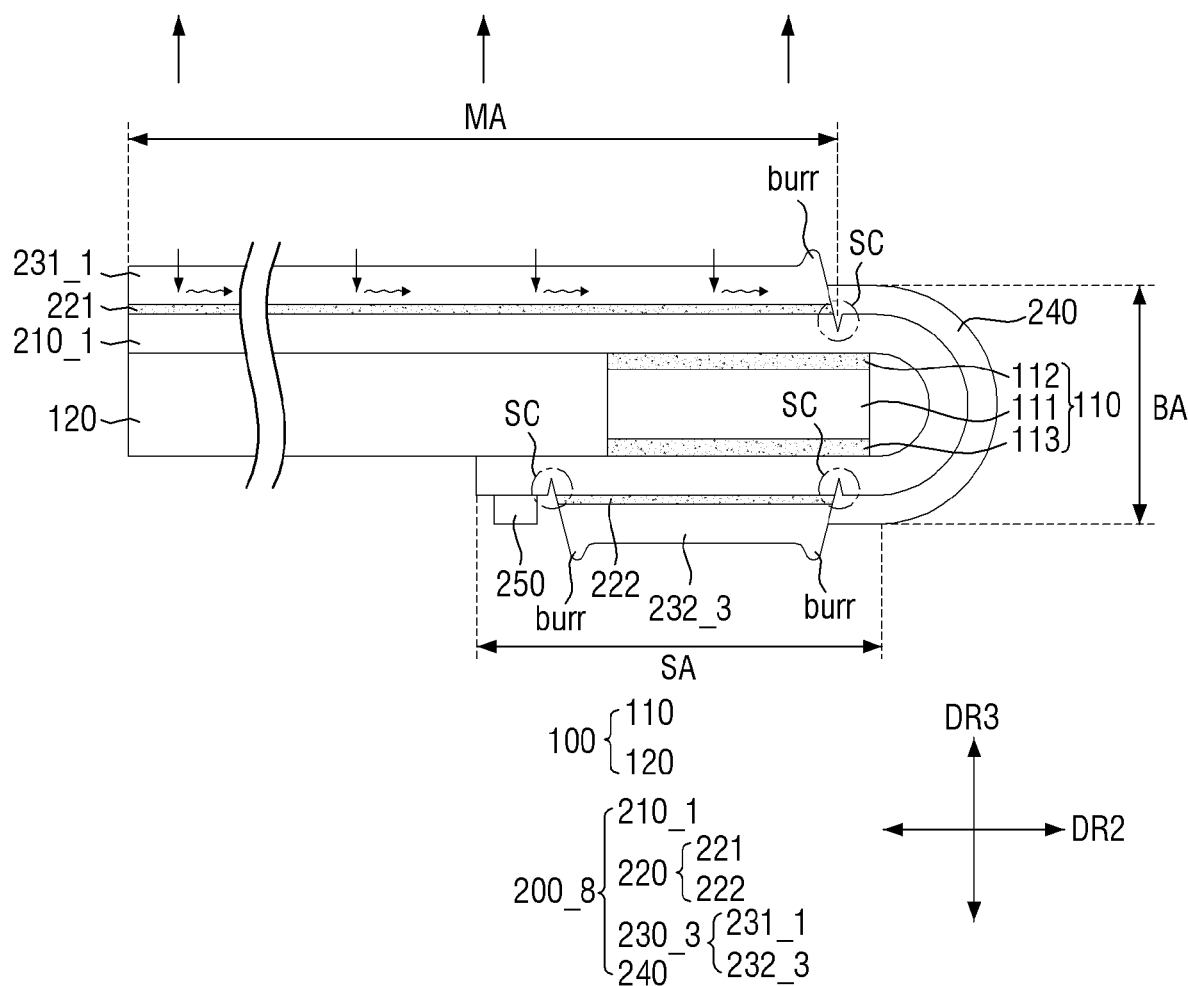
FIG. 23 is a cross-sectional view illustrating the display device of FIG. 22 in a bent state.

FIG. 22 is a cross-sectional view of a display device according to another exemplary embodiment of the present disclosure; and FIG. 23 is a cross-sectional view illustrating the display device of FIG. 22 in a bent state.

Referring to FIGS. 22 and 23, a display module 200_8 of a display device 11 may be scribed along the boundary between a main area MA and a bending area BA, the boundary between the bending area BA and a sub-area SA, and both edges of an end portion of the sub-area SA by one or more cutting members (e.g., 700 of FIG. 27A) that will be described later. In this case, the display device 11 may include burrs formed on first and second polarizing films 231_1 and 232_3 of a polarizing film 230_3 to have a thickness (e.g., a predetermined thickness), and an inner side of the first polarizing film 231_1 adjacent to the bending area BA and an inner side of the second polarizing film 232_3 adjacent to a data driver chip 250 may be inclined. Also, in an embodiment, the display device 11 may include scratches SC formed on a display panel 210_1 along the boundary between the main area MA and the bending area BA, the boundary between the bending area BA and the sub-area SA, and the boundary between the second polarizing film 232_3 and the data driver chip 250.

Figure 24:
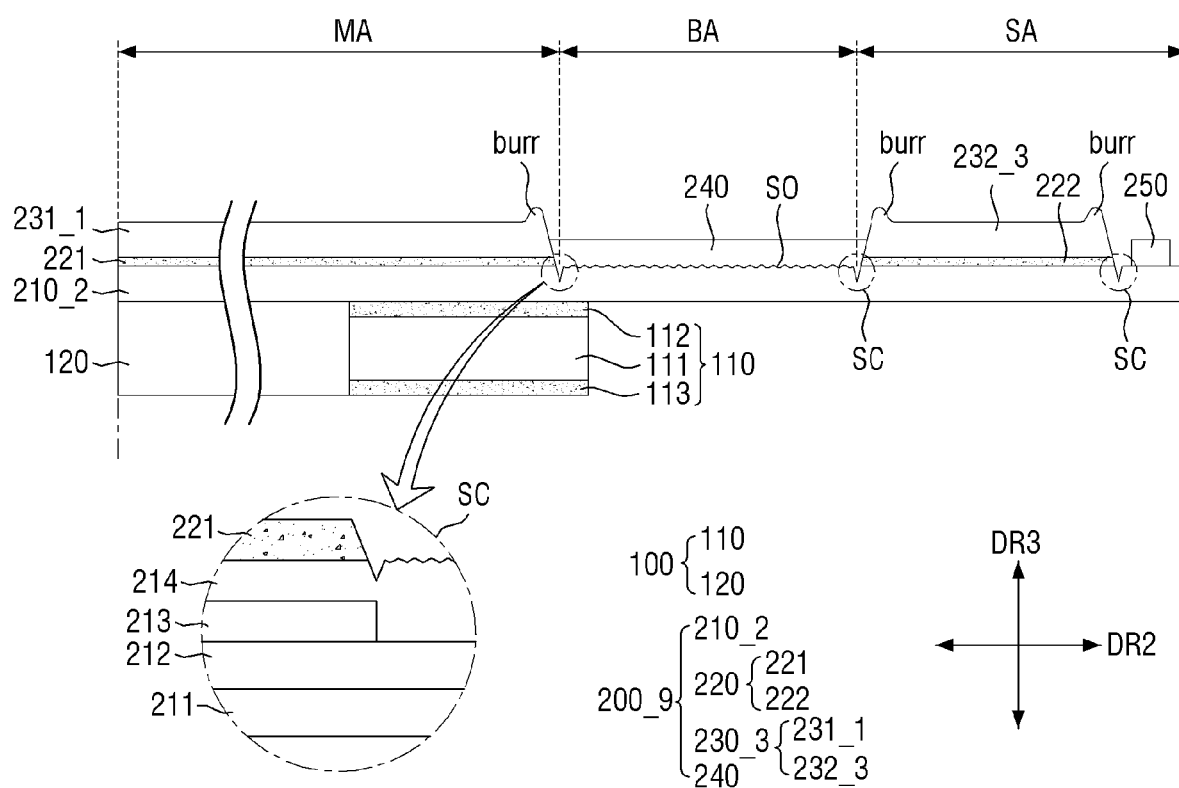
FIG. 24 is a cross-sectional view of a display device according to another exemplary embodiment of the present disclosure.
Figure 25:
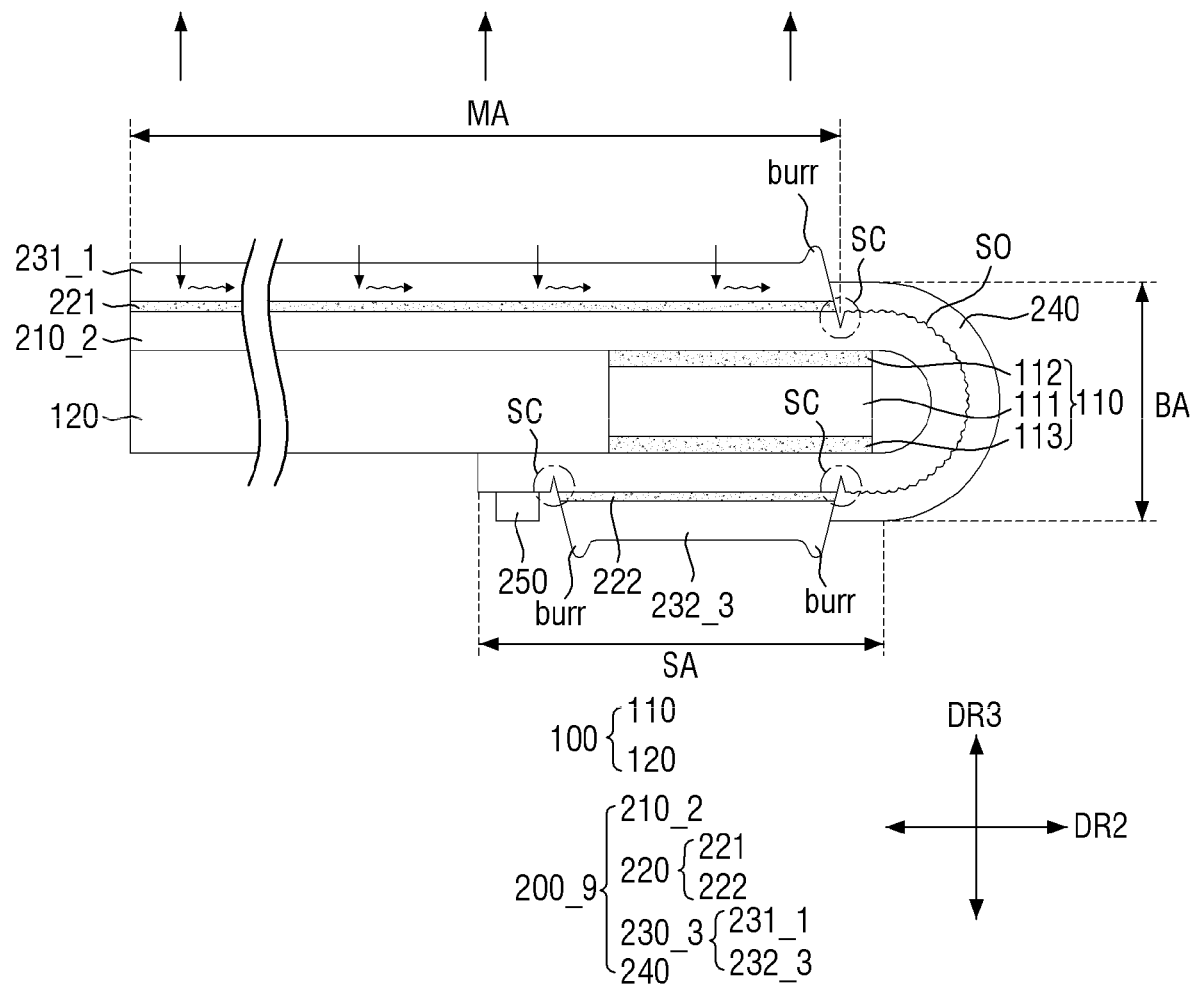
FIG. 25 is a cross-sectional view illustrating the display device of FIG. 24 in a bent state.

FIG. 24 is a cross-sectional view of a display device according to another exemplary embodiment of the present disclosure; and FIG. 25 is a cross-sectional view illustrating the display device of FIG. 24 in a bent state.

Referring to FIGS. 24 and 25, a display module 200_9 of a display device 12 may have an entire bending area BA and one side of a sub-area SA irradiated with carbon dioxide ($CO_2$) by one or more first laser members (e.g., 600 of FIG. 26A) that will be described later. The display device 12 differs from the display device 11 of FIGS. 22 and 23 in that the display device 12 further includes soot SO on a first surface of the bending area BA of a display panel 210_2.

A method of manufacturing the display device 1 according to an exemplary embodiment of the present disclosure will hereinafter be described. A method of manufacturing a display device may be classified as a cell-based manufacturing method in which each individual display device is fabricated separately, and a mother substrate-based manufacturing method in which a plurality of display devices are concurrently (e.g., simultaneously) fabricated using a mother substrate and are separated later. The mother substrate-based manufacturing method may be more advantageous than the cell-based manufacturing method in terms of processing time and cost.

In an exemplary embodiment, a mother substrate 300 may be a rigid substrate formed of glass or quartz or a film including PET. Each display module 200 may be disposed on the surface of the mother substrate 300, and a polarizing film 230 may be disposed on the entire surface of each display module 200 and may be attached to a first surface of each display module 200 via a first adhesive member 220. In an exemplary embodiment, the polarizing film 230 may include main areas MA, sub-areas SA, and bending areas BA disposed between the main areas MA and the sub-areas SA. By partially removing the polarizing film 230 from the bending areas BA of the display panel 210, the first polarizing films 231 and the second polarizing films 232 may be separated. The first polarizing films 231 may be disposed on first surfaces of the main areas MA of the display panel 210, and the second polarizing films 232 may be disposed on first surfaces of the sub-areas SA of the display panel 210.

In an embodiment, the separation of the first polarizing films 231 and second polarizing films 232 may include weakening the adhesive force of the first adhesive member 220, scribing along both edges of each bending area BA and both edges of each area where a data driver chip 250 is to be disposed, and partially removing the polarizing film 230 from each scribed region.

Figure 26A:
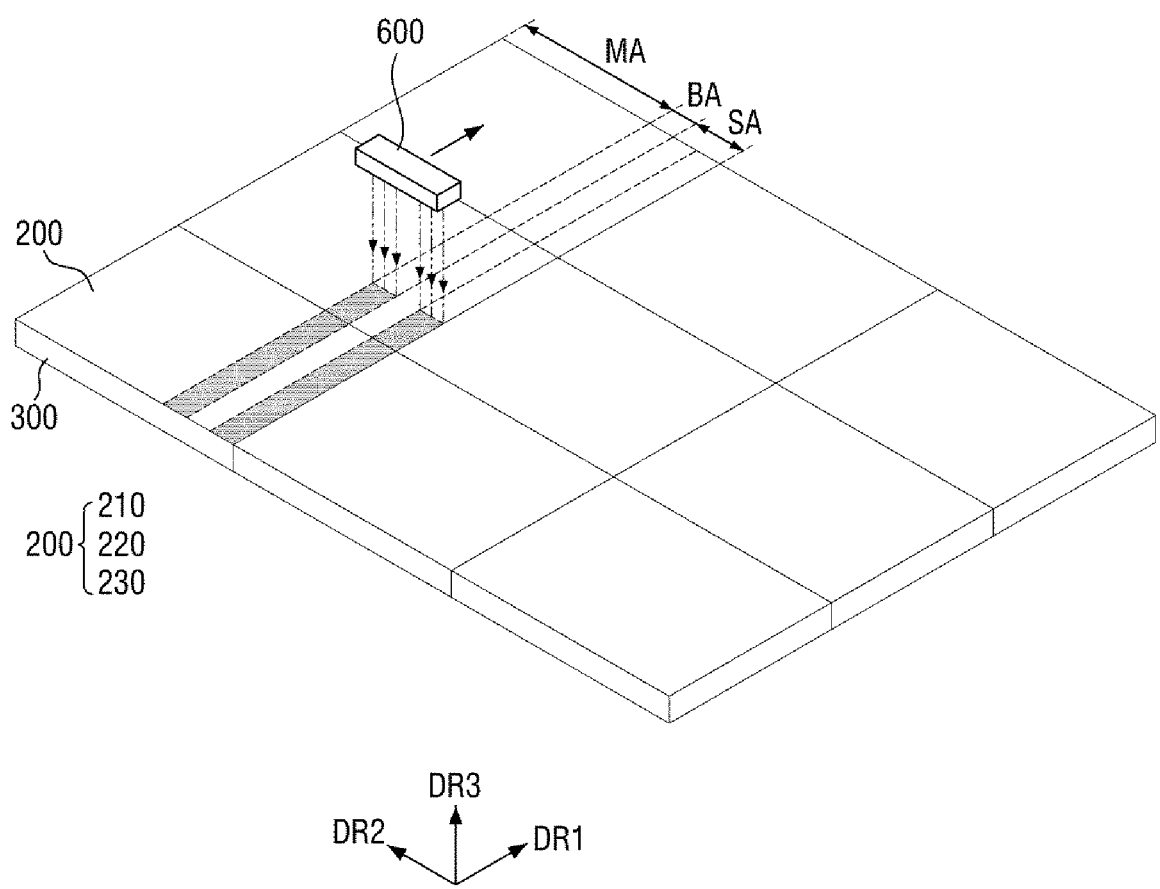
FIGS. 26A, 26B, and 27A through 27D are perspective views illustrating methods of manufacturing a display device according to exemplary embodiments and modified examples of the present disclosure.
Figure 26B:
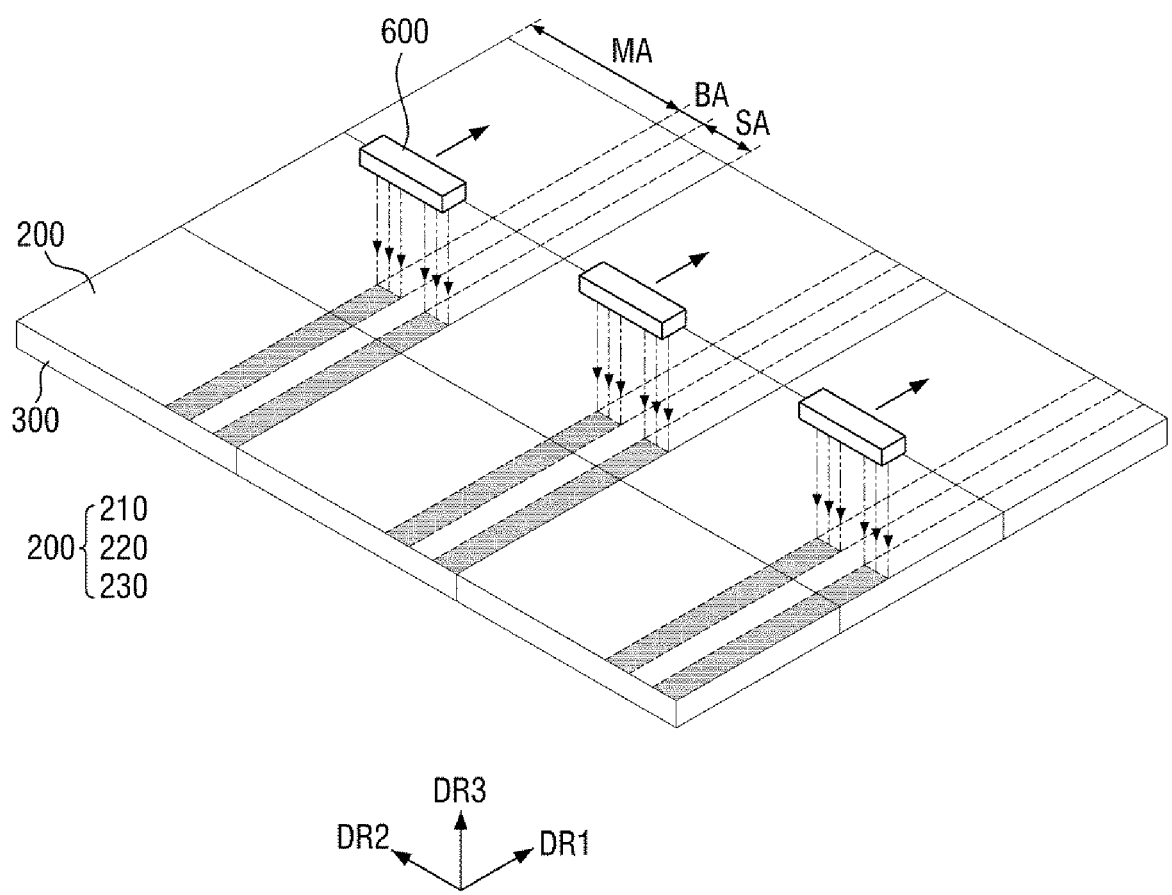

FIGS. 26A and 26B are perspective views illustrating examples of the step of weakening the adhesive force of a first adhesive member as performed in a method of manufacturing a display device according to an exemplary embodiment of the present disclosure. When the mother substrate-based manufacturing method is used, main areas MA, bending areas BA, or sub-areas SA of cells (or display modules 200) that are adjacent to one another in a first direction DR1 may be adjacent to one another.

Referring to FIG. 26A, the display modules 200 may be disposed on the entire top surface of the mother substrate 300. A first laser member 600 may be placed above the display modules 200. The first laser member 600 may apply carbon dioxide to an adhesive member in a desired area and may thus weaken the adhesive force of the adhesive member. In an exemplary embodiment, the first laser member 600 may apply carbon dioxide to the entire bending areas BA and parts of the sub-areas SA. The first laser member 600 may apply carbon dioxide, from above the display modules 200, to the bending areas BA of cells that are adjacent to one another in the first direction DR1 and parts of the sub-areas SA of the cells along the first direction DR1. In an embodiment, the first laser member 600 may weaken the adhesive forces of the first and second adhesive films 221 and 222 by moving only once over the bending areas BA of cells that are adjacent to one another in the first direction DR1 and over parts of the sub-areas SA of the cells.

The example of FIG. 26B differs from the example of FIG. 26A in that multiple first laser members 600 are placed above the display modules 200 along a second direction DR2. According to the example of FIG. 26B, the first laser members 600 can weaken the adhesive forces of the first and second adhesive films 221 and 222 not only in the bending areas BA and the sub-areas SA of cells that are adjacent to one another in the first direction DR1, but also in the bending areas BA and the sub-areas SA of cells that are adjacent to one another in the second direction DR2, by moving only once over the bending areas BA and the sub-areas SA of all the cells.

FIGS. 27A through 27D are perspective views illustrating methods of manufacturing a display device according to exemplary embodiments and modified examples of the present disclosure. Specifically, FIGS. 27A through 27D illustrate examples of the step of scribing a polarizing film 230 along the boundaries between the main areas MA and the bending areas BA, the boundaries between the bending areas BA and the sub-areas SA, and the edges of an end portion of each of the sub-areas SA with one or more cutting members 700 or 701.

Figure 27A:
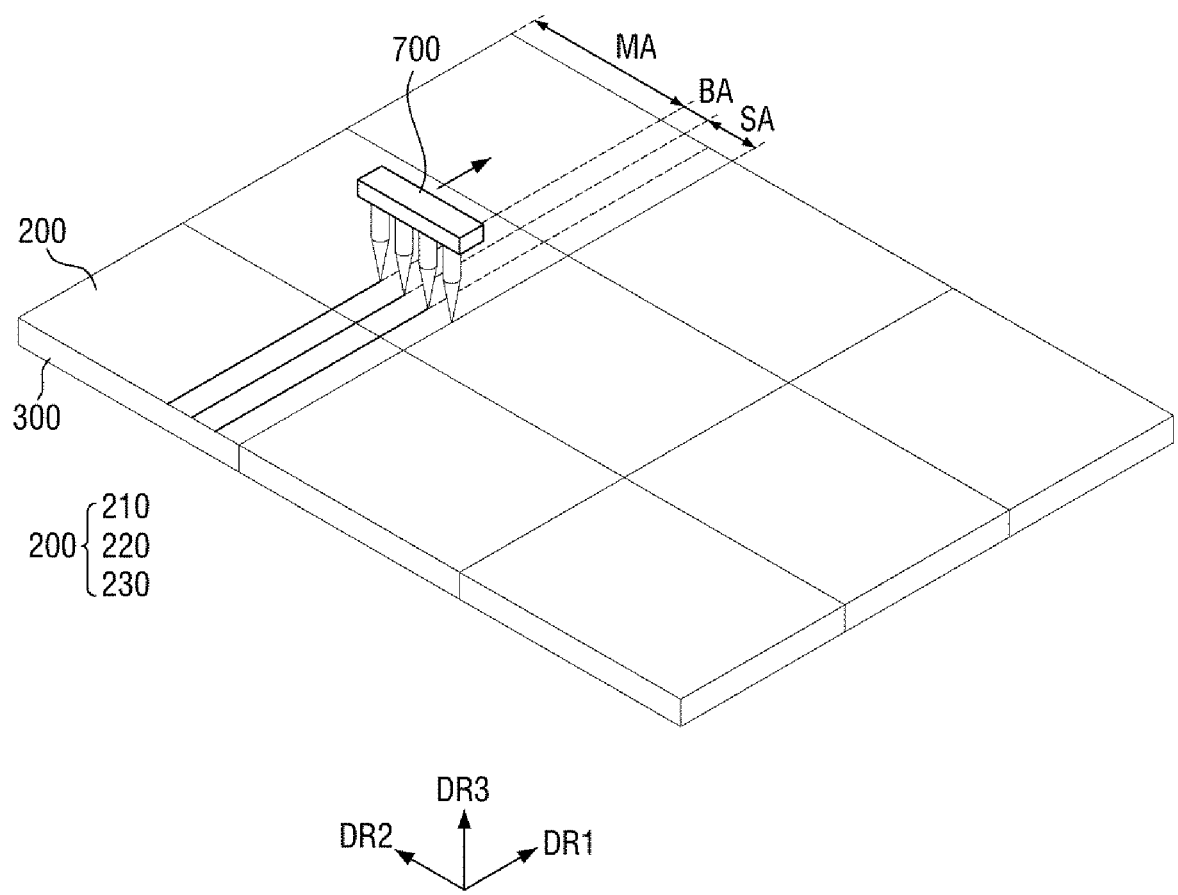

Referring to FIG. 27A, the polarizing film 230 may be scribed along the boundaries between the main areas MA and the bending areas BA, the boundaries between the bending areas BA and the sub-areas SA, and the edges of the end portion of each of the sub-areas SA by a cutting member or knife 700. In an embodiment, the knife 700 may be a heat knife having a higher melting point than the polarizing film 230, but the present disclosure is not limited thereto. As described above, since the boundaries between the main areas MA and the bending areas BA, the boundaries between the bending areas BA and the sub-areas SA, and the edges of the end portion of each of the sub-areas SA extend across cells that are adjacent to one another in the first direction DR1, the knife 700 can continuously scribe the polarizing film 230 and the first adhesive member 220 along the first direction DR1 without interruption.

Figure 27B:
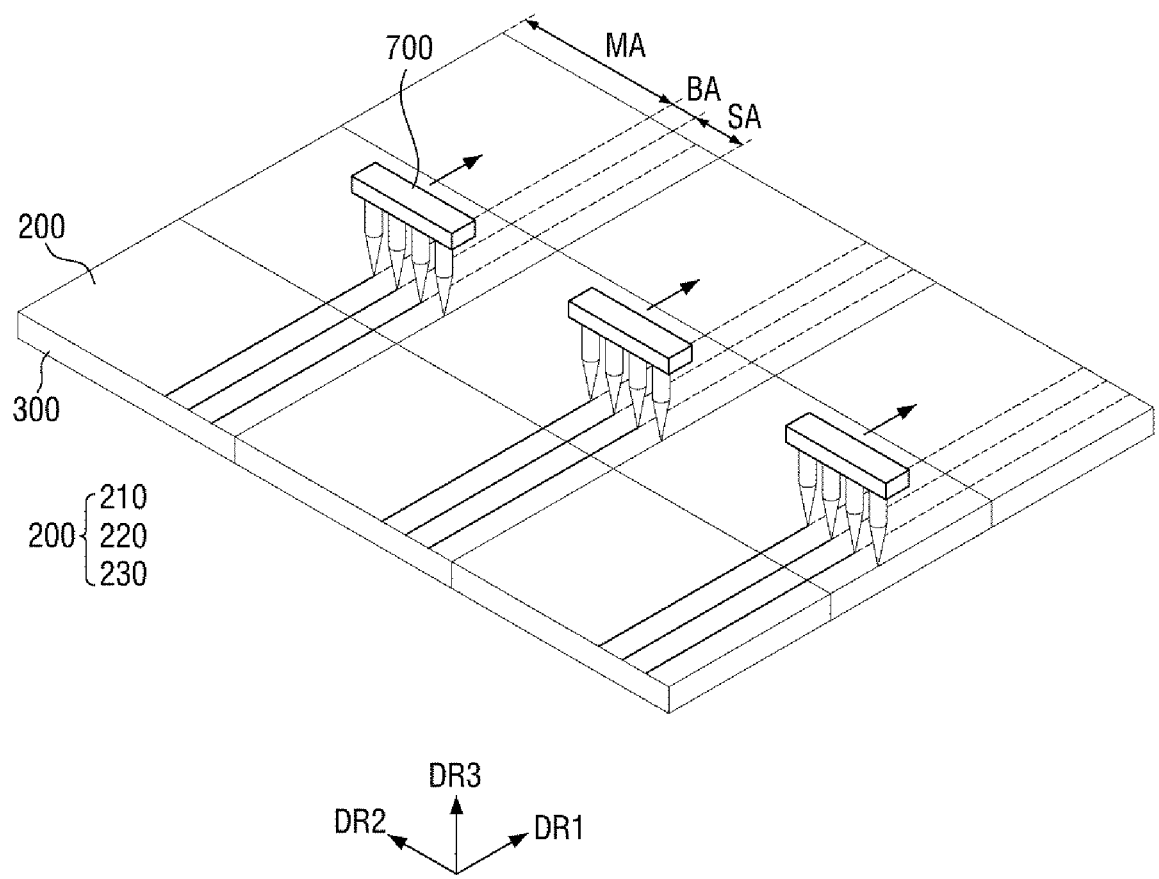

The example of FIG. 27B differs from the example of FIG. 27A in that multiple cutting members or knives 700 are used. Specifically, multiple knives 700 may be placed above the display modules 200 along the second direction DR2.

Even in this case, since the boundaries between the main areas MA and the bending areas BA, the boundaries between the bending areas BA and the sub-areas SA, and the edges of the end portion of each of the sub-areas SA extend across cells that are adjacent to one another in the first direction DR1, the knives 700 can continuously scribe the polarizing film 230 and the first adhesive member 220 along the first direction DR1 without interruption. Also, since multiple knives 700 are placed along the second direction DR2, multiple cells that are adjacent to one another in the second direction DR2 can be scribed at the same time.

Figure 27C:
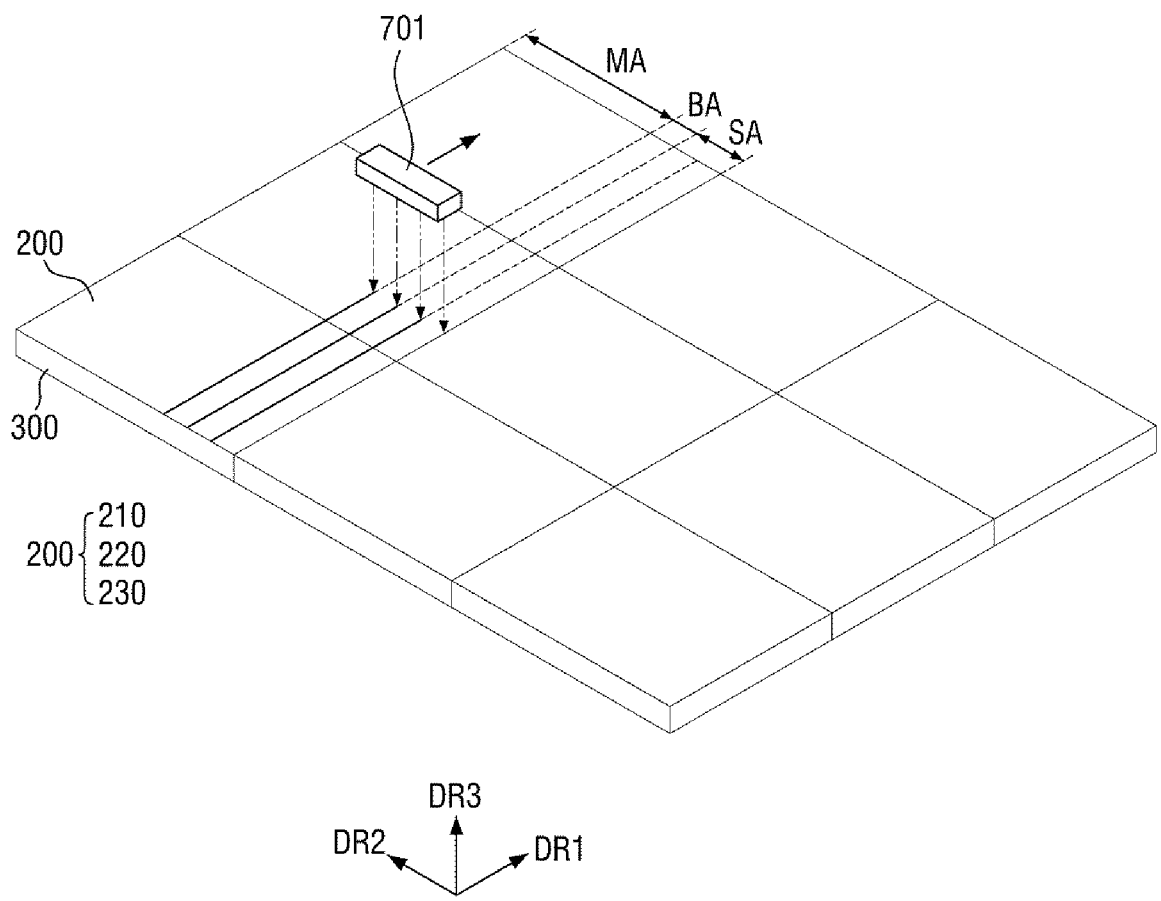

Referring to FIG. 27C, the polarizing film 230 may be scribed along the boundaries between the main areas MA and the bending areas BA, the boundaries between the bending areas BA and the sub-areas SA, and the edges of the end portion of each of the sub-areas SA by a second laser member 701. The second laser member 701 may be an ultraviolet (UV) laser, but the present disclosure is not limited thereto. As described above, since the boundaries between the main areas MA and the bending areas BA, the boundaries between the bending areas BA and the sub-areas SA, and the edges of the end portion of each of the sub-areas SA extend across cells that are adjacent to one another in the first direction DR1, the second laser member 701 can continuously scribe the polarizing film 230 and the first adhesive member 220 along the first direction DR1 without interruption.

Figure 27D:
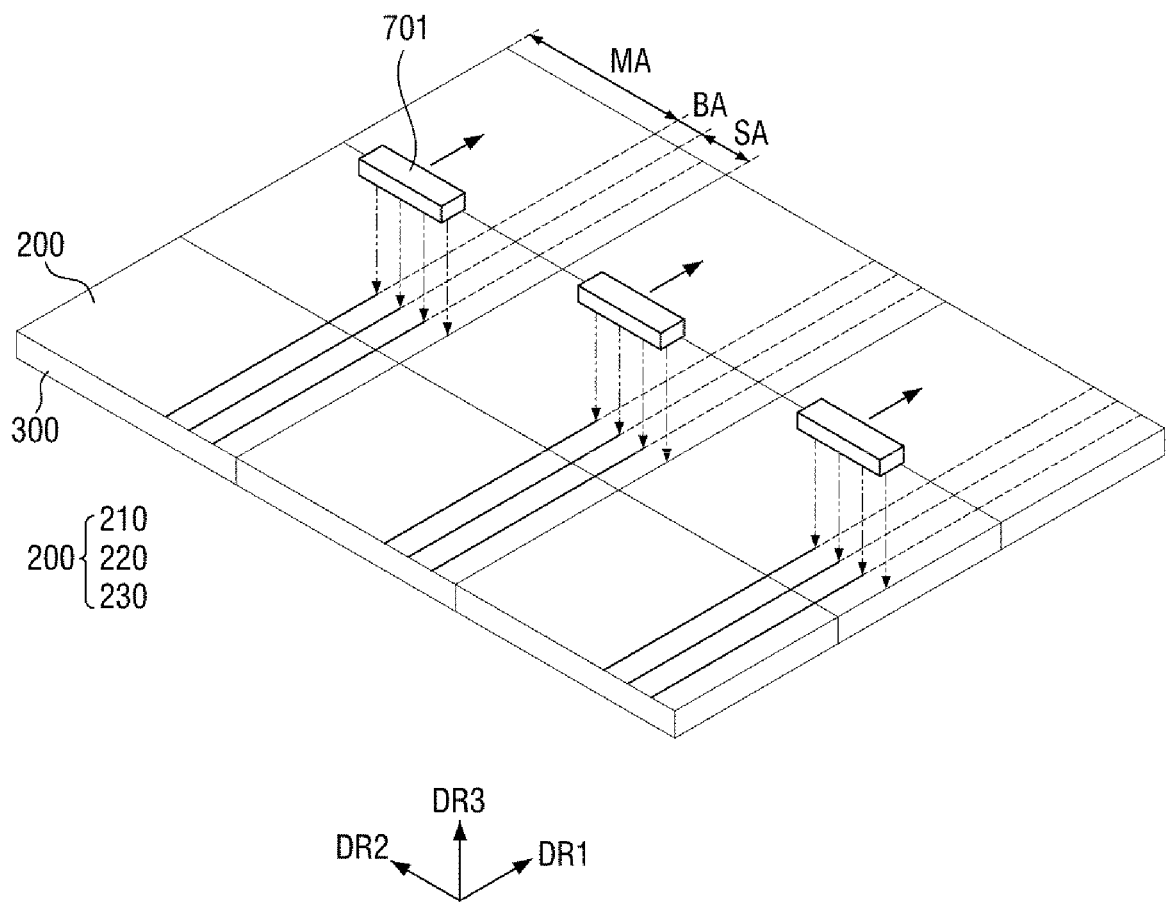

The example of FIG. 27D differs from the example of FIG. 27C in that multiple second laser members 701 are used. Specifically, multiple second laser members 701 may be placed above the display modules 200 along the second direction DR2. Even in this case, since the boundaries between the main areas MA and the bending areas BA, the boundaries between the bending areas BA and the sub-areas SA, and the edges of the end portion of each of the sub-areas SA extend across cells that are adjacent to one another in the first direction DR1, the second laser members 701 can continuously scribe the polarizing film 230 and the first adhesive member 220 along the first direction DR1 without interruption. Also, since multiple second laser members 701 are placed along the second direction DR2, multiple cells that are adjacent to one another in the second direction DR2 can be scribed at the same time.

After performing scribing, as described above with reference to FIGS. 26A through 27D, the polarizing film 230 may be removed from each scribed region, thereby separating the first polarizing films 231 and the second polarizing films 232. Thereafter, the passivation films 240 may be further disposed on first surfaces of the bending areas BA, and the data driver chips 250 may be further disposed on first surfaces of the end portions of the sub-areas SA. The passivation films 240 may be disposed between the first polarizing films 231 and the second polarizing films 232, and the second polarizing films 232 may be disposed between the data driver chips 250 and the bending areas BA.

Thereafter, cells are separated from the mother substrate 300, thereby obtaining each individual display module 200. Thereafter, each individual display module 200 may be bent in a bending direction, thereby obtaining a flexible display device.

The aspects and effects of the embodiments are not limited by the contents exemplified above, and other various aspects and effects are included in the present specification.

Although some exemplary embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:
1. A display device comprising:
a display panel comprising a first area, a second area, and a bending area between the first area and the second area;
a first polarizing film on a first surface of the first area of the display panel; and
a second polarizing film on a first surface of the second area of the display panel,
wherein the first and second polarizing films are spaced apart from each other with the bending area therebetween,
the first and second areas of the display panel overlap with each other in a thickness direction, and
the first surfaces of the first and second areas of the display panel face away from each other.
2. The display device of claim 1, wherein
second surfaces of the first and second areas of the display panel are opposite to each other.
3. The display device of claim 2, wherein the second polarizing film overlaps with the first polarizing film in the thickness direction.
4. The display device of claim 2, wherein the first and second polarizing films comprise a same material.
5. The display device of claim 4, wherein a thickness of the first polarizing film is the same as a thickness of the second polarizing film.
6. The display device of claim 2, further comprising an adhesive member between the second surfaces of the first and second areas of the display panel and bonding the second surfaces of the first and second areas of the display panel.
7. The display device of claim 6, further comprising:
a gap between a first side of the adhesive member and a second surface of the bending area of the display panel; and
a spacer in the gap,
wherein the spacer is in contact with the first side of the adhesive member and the second surface of the bending area of the display panel.
8. The display device of claim 2, wherein
a direction in which a first side of the first polarizing film extends is the same as a direction in which a first side of the second polarizing film extends, and
the first sides of the first and second polarizing films face each other.

9. The display device of claim 8, wherein a distance between the first sides of the first and second polarizing films is uniform along the direction in which the first side of the first polarizing film extends.

10. The display device of claim 2, wherein the first and second polarizing films comprise burr-shaped portions near the bending area.

11. The display device of claim 2, wherein the display panel comprises recessed scratches near the bending area in the thickness direction.

12. The display device of claim 2, wherein the display panel comprises soot on the first surface of the bending area of the display panel.

13. A display device comprising:
a display panel comprising a first area, a second area, and a bending area between the first area and the second area;
a first polarizing film on a first surface of the first area of the display panel;
a second polarizing film on a first surface of the second area of the display panel; and
a passivation film on a first surface of the bending area of the display panel,
wherein the first and second polarizing films are spaced apart from each other with the bending area therebetween,
the first and second areas of the display panel overlap with each other in a thickness direction, and
second surfaces of the first and second areas of the display panel are opposite to each other.

14. The display device of claim 13, wherein
a first side of the passivation film faces a first side of the first polarizing film, and
a second side of the passivation film faces a first side of the second polarizing film.

15. The display device of claim 13, wherein the passivation film covers a part of a top surface of the first polarizing film or a part of a top surface of the second polarizing film.

16. A display device comprising:
a display panel comprising a first area, a second area, and a bending area between the first area and the second area;
a first polarizing film on a first surface of the first area of the display panel;
a second polarizing film on a first surface of the second area of the display panel; and
a driver chip on the first surface of the second area of the display panel,
wherein the second polarizing film is between the bending area and the driver chip,
the first and second polarizing films are spaced apart from each other with the bending area therebetween,
the first and second areas of the display panel overlap with each other in a thickness direction, and
second surfaces of the first and second areas of the display panel are opposite to each other.

17. The display device of claim 16, wherein the second polarizing film covers a first side and a top surface of the driver chip.

18. The display device of claim 16, wherein
the second area of the display panel comprises a sub-area adjacent to the bending area and a driver chip area adjacent to an end of the second area, and
the second polarizing film is located in the sub-area and the driver chip area and in a part of the driver chip area between a second surface of the display panel and the driver chip.

19. A method of manufacturing a display device, the method comprising:
arranging a polarizing film on a first surface of a display panel comprising a first area, a second area, and a bending area between the first area and the second area; and
separating the polarizing film into a first polarizing film, which is on the first area of the display panel, and a second polarizing film, which is on the second area of the display panel, by removing the polarizing film from the bending area of the display panel and from an area on a side of the second area of the display panel,
wherein the first and second areas of the display panel overlap with each other in a thickness direction, and
the first surface of the display panel in the first area faces away from the first surface of the display panel in the second area.

20. The method of claim 19, further comprising arranging a passivation film on the bending area of the display panel, and arranging a driver chip in an area where the second area of the display panel is exposed.

21. A display device comprising:
a display panel comprising a first area, a second area, and a bending area between the first area and the second area;
a first polarizing film on a first surface of the first area of the display panel; and
a passivation film on each of a first surface of the bending area and a first surface of the second area of the display panel,
wherein the first and second areas of the display panel overlap with each other in a thickness direction, and
the first surfaces of the first and second areas of the display panel face away from each other.

* * * * *